(12) United States Patent
Asauchi et al.

(10) Patent No.: US 7,499,372 B2
(45) Date of Patent: Mar. 3, 2009

(54) SEMICONDUCTOR MEMORY DEVICE

(75) Inventors: Noboru Asauchi, Nagano-ken (JP);
Eitaro Otsuka, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 398 days.

(21) Appl. No.: 11/420,603

(22) Filed: May 26, 2006

(65) Prior Publication Data
US 2008/0212379 A1 Sep. 4, 2008

(30) Foreign Application Priority Data
May 30, 2005 (JP) .............................. 2005-157186
Jun. 23, 2005 (JP) .............................. 2005-182805

(51) Int. Cl.
*G11C 8/00* (2006.01)

(52) U.S. Cl. ............. 365/239; 365/185.18; 365/185.23; 365/230.09; 365/233.1

(58) Field of Classification Search ................. 365/239, 365/185.18, 185.23, 230.09, 233.1
See application file for complete search history.

(56) References Cited

U.S. PATENT DOCUMENTS
2008/0144382 A1* 6/2008 Asauchi et al. ......... 365/185.18

FOREIGN PATENT DOCUMENTS
JP 11-102328 A 4/1999
JP 2004-074464 A 3/2004

OTHER PUBLICATIONS
English translation of International Preliminary Report on Patentability, dated Dec. 21, 2007, in PCT/JP2006/311053.
International Search Report dated Jul. 4, 2006, in PCT/JP2006/311053.

* cited by examiner

*Primary Examiner*—Pho M. Luu
(74) *Attorney, Agent, or Firm*—Stroock & Stroock & Lavan LLP

(57) ABSTRACT

When writing 16-bit write data to the memory array 100 which can store data of 8 bits per 1 row, the semiconductor memory device 10 first writes the upper 8 bits to the 1st write restricted row of the memory array 100. The increment controller 150 determines whether or not the value of the existing data written to the memory array 100 and the write data used for writing latched to the 8-bit latch register 170 match. When the existing data and the write data match, the increment controller 150 outputs the write enable signal WEN1 to the write/read controller 140 and executes the writing of the lower 8 bits of write data to the memory array 100.

27 Claims, 13 Drawing Sheets

SEMICONDUCTOR MEMORY DEVICE

CROSS-REFERENCE TO RELATED APPLICATION

This application relates to and claims priority from Japanese Patent Application No. 2005-157186, filed on May 30, 2005, and Japanese Patent Application No. 2005-182805, filed on Jun. 23, 2005 the entire disclosure all of which are incorporated by reference.

BACKGROUND OF THE INVENTION

1. Field of the Invention

The present invention relates to semiconductor memory devices capable of rewriting data, a sequentially accessed semiconductor memory device and to a method of controlling writing of data to a sequentially accessed semiconductor memory device.

2. Description of the Related Art

Rewritable semiconductor memory devices, such as EEPROMs, flash ROM, and the like, are used broadly as memory devices in a variety of electronic equipment. In electronic devices, this type of semiconductor memory device is not limited in terms of overwriting inputted data that fulfills data conditions established in advance, however, in some cases it would be desirable to use these semiconductor memory devices under conditions that restrict the overwriting with input data that does not fulfill these data conditions. For example, such conditions may include, for example, "perform writing only if the write data is larger than the data that is recorded in the semiconductor memory device (hereinafter termed the "data to be overwritten")," or the condition of "perform writing only if the write data is smaller than the data to be overwritten."

However, conventional rewritable semiconductor memory devices have no system by which to limit the overwriting of data, and because it is possible to overwrite data that has been stored if the prescribed sequence for writing data is performed, it has not been possible to apply data conditions, such as described above, to overwriting.

Note that, as technologies for controlling the writing of data to a memory device, there is a known technology for providing a write-prevention device for a memory device external to said memory device, and a known technology for preventing writing to a data storage area when the memory device is as used by writing data indicating the prohibition of writing to a data storage area with an address beyond a particular data storage area in the memory device.

Moreover, Semiconductor memory devices that allow only sequential access to the data cells of a memory array, for example, EEPROMs, are known. This kind of semiconductor memory device is relatively inexpensive, so is used as a storage device for holding data related to the remaining volume of or consumed volume of consumer goods. Here, the memory array typically has a grid type internal structure of x rows X y columns, and when each data cell holds 1 bit of data, it is possible to store y bits of data per 1 row.

SUMMARY OF THE INVENTION

However, typically, access to the memory array is managed using row units, so when writing data of multiple n of y bits (n is an integer of 2 or greater) to this kind of data cell, writing must be done with division of data n times. As a result, compared to when writing ny bits of data at one time, the write operation is executed n times, so the possibility of the writing not being completed correctly increases.

This problem is eliminated by using a memory array of x rows X ny columns, but when a semiconductor memory device equipped with a memory array of x rows X ny columns is shared for a device that writes y bits of data and a device that writes ny bits of data, part of the columns (data cells) of the x rows X ny columns memory array are not used. As a result, a problem occurs of not being able to effectively utilize the memory array, and there is the problem that it is necessary to execute access to unnecessary data cells to access the desired data cells because of the fact that this is a sequential access method, so the access speed decreases.

The present invention was created to address the problems noted above, and one object of the present invention is to increase the reliability of the writing of data of data lengths longer than the data length that may be stored in one row of a memory array that the semiconductor memory device is equipped with. Another object of the present invention is to prohibit writing, in the semiconductor memory device, of input data that does not fulfill specific data requirements.

A first aspect of the present invention to address the problems provides a semiconductor memory device. The semiconductor memory device of the first aspect of the present invention includes a sequentially accessed non-volatile memory array that has a plurality of data storage rows of a specified address unit, write data holding module that holds write data of a data capacity correlating to n times (n is an integer of 2 or greater) the specified address unit in the specified address units, the data being the write data to be written to the memory array, data writing module that writes in the specified address unit the held write data to the subject data storage row that is subject to writing in the memory array, data verification module that determines whether or not the already written data of the specified address unit written to the subject data storage row and the write data of the specified address unit held in the write data holding module match, and a control unit that, when the already written data and the write data do not match, does not execute writing of the remaining write data to the next data storage row of the subject data storage row using the data writing module.

According to the semiconductor memory device of the first aspect of the present invention, when writing in the specified address unit to the memory array the write data of the data capacity that correlates to n times the specified address unit that may be stored in the data storage row of the memory array, a determination is made of whether or not the already written data of the specified address unit written to the subject data storage row and the write data of the specified address unit held in the write data holding module match, and when they do not match, the writing of the remaining write data to the next data storage row of the subject data storage row by the data write module is not executed. Therefore, it is possible to increase the reliability of writing of data of data lengths longer than the data length that may be stored in 1 row of the memory array that the semiconductor memory device is equipped with.

In the semiconductor memory device of the first aspect of the present invention, when the already written data and the write data match, the control unit may execute writing of the write data to the next data storage row of the subject data storage row using the data writing module. In that case, the remaining write data may be sequentially written into the memory array while maintaining the reliability of the data.

In the semiconductor memory device of the first aspect of the present invention, the data verification module may read the already written data in the address units from the subject data storage row after writing of the write data to the subject data storage row has ended, and using the already written data read in the specified address unit and the write data of the specified address unit, a determination may be made of whether or not the already written data and the write data match. In that case, it is possible to determine whether or not already written data and write data match, in the specified address units In the semiconductor memory device of the first aspect of the present invention, the data verification module, after writing of the write data to the subject data storage row has ended, may read the already written data for each 1 address from the subject data storage row and also fetches the write data in 1 address units from the write data holding module, and using the already written data read in the specified 1 address unit and the fetched 1 address unit write data, a determination may be made of whether or not the already written data and the write data match. In that case, it is possible to determine whether or not already written data and write data match, in 1 address units.

In the semiconductor memory device of the first aspect of the present invention may further comprise existing data holding module that holds existing data stored in the subject data storage row before the write data is written; and data write back module that writes back the existing data held in the existing data holding module to the subject data storage row when it is determined by the data verification module that the already written data and the write data do not match. In that case, the data stored in the memory array may be restored to what it was before the write data is written.

In the semiconductor memory device of the first aspect of the present invention, data may be stored in the data storage row in sequence from the most significant bit, and the data write module may execute writing of the data in sequence from the most significant bit to the memory array. In that case, it is possible to determine much swiftly whether or not the value of the write data and the value of the read existing data match.

A second aspect of the present invention provides a semiconductor memory device. The semiconductor memory device of the second aspect of the present invention includes a sequentially accessed non-volatile memory array that has a plurality of data storage rows having 8 data cells that store 1 bit of data, write data holding module that holds in 8-bit units write data to be written to the memory array, holding the write data in multiple n of 8 bits (n is an integer of 2 or greater), data writing module that writes in 8-bit units the held write data to the subject data storage row that is the subject of writing to the memory array, data verification module that determines whether or not the 8 bits of already written data written to the subject data storage row and the 8 bits of write data held in the write data holding module match, and a control unit that, when the already written data and the write data do not match, does not execute writing of the remaining write data to the next data storage row of the subject data storage row.

According to the semiconductor memory device of the second aspect of the present invention, when writing in 8-bit units to the memory array the write data of the data capacity correlating to n times the specified 8 bits that may be stored to the data storage row of the memory array, a determination is made of whether or not the 8-bit already written data written to the subject data storage row and the 8-bit write data held in the write data holding module match, and when they do not match, the writing of the remaining write data to the next data storage row of the subject data storage row by the data writing module is not executed. Therefore, it is possible to increase the reliability of the writing of data of a data length longer than the data length that may be stored in 1 row of the memory array that the semiconductor memory device is equipped with.

In the semiconductor memory device of the second aspect of the present invention, when the already written data and the write data do match, the control unit may execute writing of the write data to the next data storage row of the subject data storage row using the data writing module. In that case, the remaining write data may be sequentially written into the memory array while maintaining the reliability of the data.

A third aspect of the present invention provides a write control method of writing write data of the data capacity correlating to n times (n is an integer of 2 or greater) of the specified address unit to a semiconductor memory device that has a sequentially accessed non-volatile memory array that has a plurality of data storage rows of a specified address unit. The write control method of the third aspect of the present invention receives the write data of the data capacity correlating to n times the specified address unit, holds in the specified address unit the received write data, writes in the specified address unit the held write data to the subject data storage row that is subject to write in the memory array, determines whether or not the already written data of the specified address unit written to the subject data storage row and the held write data of the specified address unit match, and when the already written data and the write data do not match, does not execute writing of the remaining write data to the next data storage row of the subject data storage row.

According to the write control method of the third aspect of the present invention, it is possible to obtain the same operating effect as the semiconductor memory device of the first aspect of the present invention, and the write control method of the third aspect of the present invention may be realized using various aspects the same as with the semiconductor memory device of the first aspect of the present invention.

The write control method of the third aspect of the present invention may determine whether or not the already written data of the specified address unit written to the next data storage row and the held write data of the specified address unit match; and when the already written data and the write data do not match, not execute the writing of the remaining write data to the next data storage row of the next data storage row. Further, when the already written data and the write data match, the writing of write data of the address unit to the next data storage row of the subject data storage row may be executed. In that case, it is possible to improve the reliability of the writing of write data to a plurality of data storage row of the memory array.

A fourth aspect of the present invention provides a write control method of writing write data of a multiple n of 8 bits (n is an integer of 2 or greater) to a semiconductor memory device that has a sequentially accessed non-volatile memory array that has a plurality of data storage rows having 8 data cells that store 1 bit of data. The write control method of the fourth aspect of the present invention receives write data of a data length of the multiple n of 8 bits, holds in 8-bit units the received write data, writes in 8-bit units the held write data to the subject data storage row that is the subject of writing to the memory array, determines whether or not the 8-bit unit already written data written to the subject data storage row and the held 8-bit unit write data match, and when the already written data and the write data do not match, the writing of the remaining write data to the next data storage row of the subject data storage row is not executed.

According to the write control method of the fourth aspect of the present invention, it is possible to obtain the same operating effect as the semiconductor memory device of the second aspect of the present invention, and the write control method of the fourth aspect of the present invention may also be realized in various aspects the same as with the semiconductor memory device of the second aspect of the present invention.

The write control method of the fourth aspect of the present invention may determine whether or not the 8-bit unit already written data written to the next data storage row and the held 8-bit unit write data match, and when the already written data and the write data do not match, not execute the writing of the remaining write data to the next data storage row of the next data storage row. Further, when the already written data and the write data match, the writing of the 8-bit unit write data to the next data storage row of the subject data storage row may be executed.

For the method of the third and fourth aspects of the present invention may in addition to this be realized as a program and as a computer readable medium on which a program is recorded.

A fifth aspect of the present invention provides a semiconductor memory device. The semiconductor memory device according to the fifth aspect of the present invention comprises a non-volatile memory array; and a read/write controller that controls writing data to said memory array and reading data out of said memory array; wherein, said read/write controller, when a request of writing data to said memory array is received, compares the value of multibit write data that has been inputted to the value of multibit stored data that is stored in a multibit memory area to which said multibit write data is to be written, with said comparison being performed bitwise manner beginning with the largest bit of said multibit write data, then if for the value of each bit of said stored data there is a bit that is determined to fulfill a specific magnitude relationship, writes the write data for the bit that has been so determined, after which checks whether or not the stored data that has been stored in the memory area to which writing has been performed matches said write data for said bit that had been determined, if there is a match, writes the write data of a bit that is after said bit that had been determined, but if there is no match, prohibits the writing of the write data of all bits that are after said bit that had been determined.

The semiconductor memory device according to the fifth aspect of the present invention makes it possible to prevent the writing of write data that does not fulfill a specific magnitude relationship, and also makes it possible to more reliably prevent the writing of write data that does not fulfill the specific magnitude relationship because after writing is performed for the write data for the bit that has been so determined to fulfill the specific magnitude relationship, a check is performed as to whether or not the stored data that has been stored in the memory area to which writing has been performed matches said write data for said bit that had been determined, wherein, if there is a match, writing is performed for the write data of a bit that is after said bit that had been determined, but if there is no match, writing is prohibited for the write data of all bits that are after said bit that had been determined.

The semiconductor memory device according to the fifth aspect of the present invention may be arranged as follows. The semiconductor memory device according to the fifth aspect of the present invention comprises a non-volatile memory array; and a read/write controller that controls writing data to said memory array and reading data out of said memory array; wherein, said read/write controller, when a request of writing data to said memory array is received, compares the value of multibit write data that has been inputted to the value of multibit stored data that is stored in a multibit memory area to which said multibit write data is to be written, with said comparison being performed bitwise manner beginning with the largest bit of said multibit write data, if for the value of each bit of said stored data there is a bit that is determined to fulfill a specific magnitude relationship, writes all at once for the write data for the n bits (where n is an integer of $2^m$, where m is a positive integer) starting with said bit that has been so determined, after which checks whether or not the stored data that has been stored in the memory area to which writing has been performed matches said write data for said bits that had been determined, wherein, if there is a match, writes in n-bit units for the write data of bits starting n bits after said bits that had been determined, but if there is no match, prohibits the writing of the write data of bits starting n bits after said bit that had been determined.

The semiconductor memory device according to the fifth aspect of the present invention makes it possible to prevent the writing of write data that does not fulfill a specific magnitude relationship, because writing is performed all at once for the write data for the n bits (where n is an integer of $2^m$, where m is a positive integer) starting with said bit that has been so judged, after which a check is performed as to whether or not the stored data that has been stored in the memory area to which writing has been performed matches said write data for said bits that had been determined, wherein, if there is a match, writing is performed in n-bit units for the write data of bits starting n bits after said bits that had been determined, but if there is no match, writing is prohibited for the write data of bits starting n bits after said bit that had been determined.

Note that the semiconductor memory device according to the fifth aspect of the present invention may be implemented also in the form of a method of controlling writing to a semiconductor memory device, in the form of a computer program, or in the form of a computer-readable medium whereon a computer program is stored.

The semiconductor memory devices according to the first, second, and fifth aspects of the present invention may be equipped with a print recording material receptor that has 1 or a plurality of print recording material receptor units for housing print recording material, and may also store information related to print recording material housed in the print recording material receptor units. This makes it possible to improve the reliability of the information pertaining to the print recording material.

The sixth aspect of the present invention provides a printing system comprising a printing device and a print recording material receptor that has a semiconductor memory device according to the first, second, and fifth aspects of the present invention, detachably mounted onto the printing device. In the printing system according to the sixth aspect f the present invention, the printing device includes a host computer, wherein the host computer is connected to a semiconductor memory device of the print recording material receptor through a data signal line, a clock signal line, a reset signal line, a positive power supply line and a negative power supply line, and sends data of the quantity of the print recording material consumed in the printing device to the semiconductor memory device; and the semiconductor memory device attached to said print recording material receptor stores, in said memory array, the quantity data regarding the print recording material that has been received. According to the sixth aspect of the present invention makes it possible to improve the reliability of writing data that is longer than the data length that may be stored in a single row in the memory array provided in the semiconductor memory device when storing information regarding the quantity of the print recording material that is consumed during printing.

DESCRIPTION OF THE PREFERRED EMBODIMENTS

Following, the semiconductor memory device and the method for controlling writing of data to the semiconductor memory device of the present invention will be described based on embodiments while referring to drawings.

Semiconductor Memory Device Constitution

Figure 1:
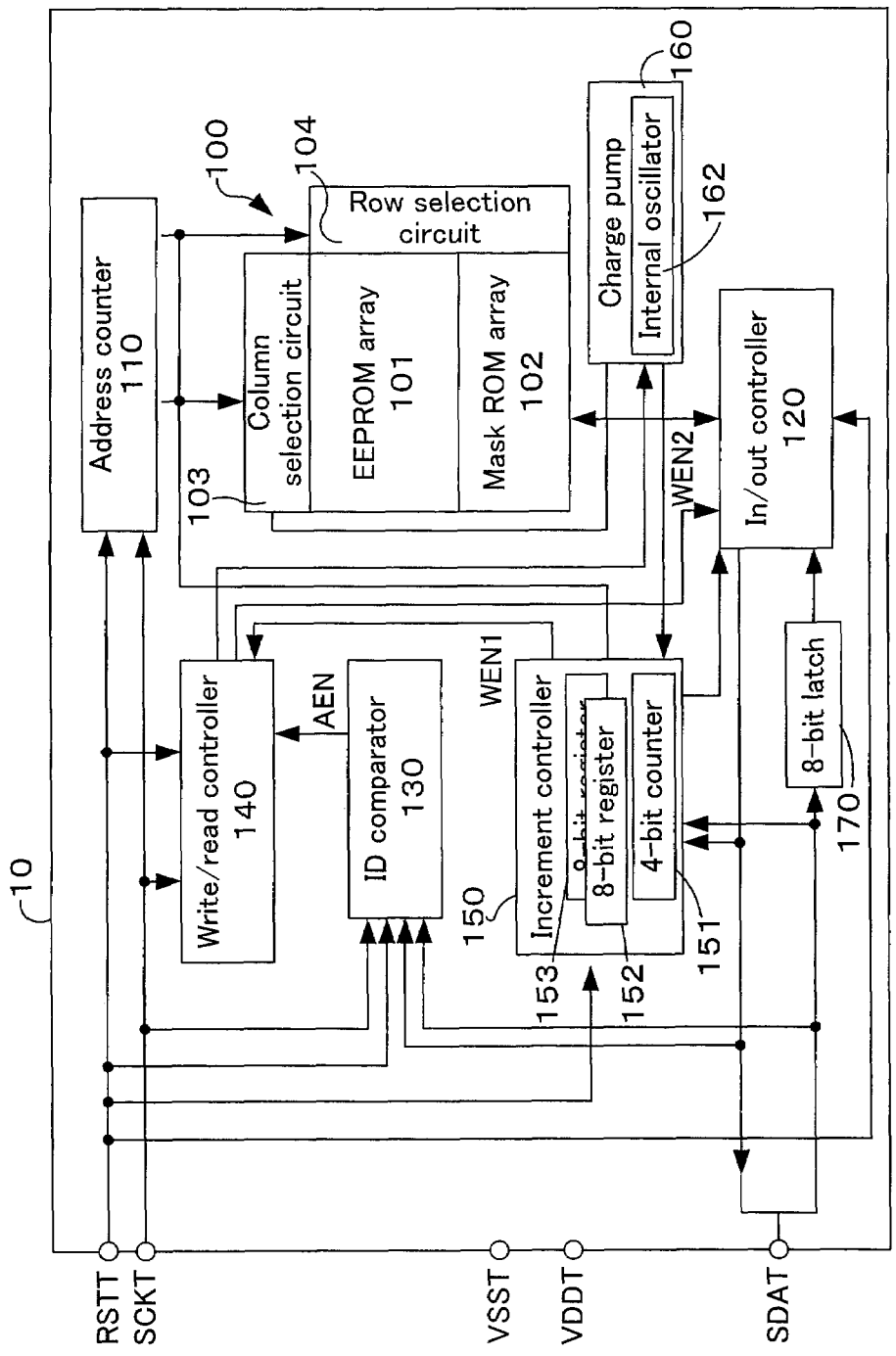
FIG. 1 is a block diagram showing the functional internal structure of the semiconductor memory device of a first embodiment.
Figure 2:
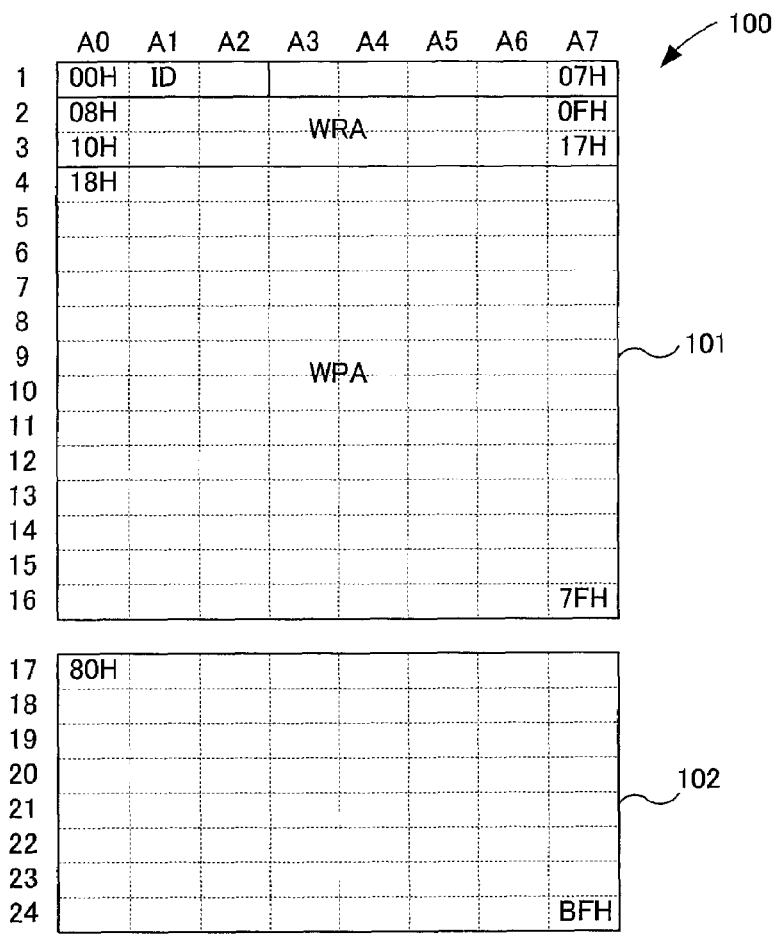
FIG. 2 is an explanatory drawing typically showing the internal structure map of the memory array that the semiconductor memory device of the first embodiment has.
Figure 3:
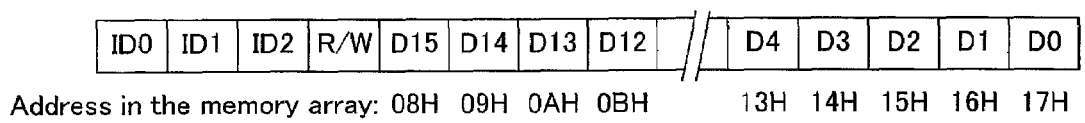
FIG. 3 is an explanatory drawing typically showing the structure of the write data written to the semiconductor memory device for the first embodiment.

The constitution of the semiconductor memory device of this embodiment will be described while referring to FIG. 1 to FIG. 3. FIG. 1 is a block diagram showing the functional internal structure of the semiconductor memory device of this embodiment. FIG. 2 is an explanatory drawing typically showing the internal structure map of the memory array that the semiconductor memory device of this embodiment has. FIG. 3 is an explanatory drawing typically showing the structure of the write data written to the semiconductor memory device for this embodiment.

The semiconductor memory device 10 of this embodiment is a sequential access type memory device that does not require inputting of address data that specifies the address of the access destination from outside. The semiconductor memory device 10 includes a memory array 100, an address counter 110, an in/out controller 120, an ID comparator 130, a write/read controller 140, an increment controller 150, a charge pump circuit 160, and an 8-bit latch register 170. Each of these circuits is connected by a bus type signal line.

The memory array 100 is equipped with an EEPROM array 101 and a mask ROM 102. The EEPROM array 101 is a storage area that has characteristics of an EEPROM for which data can be electronically erased or written, and the EEPROM array 101 used for this embodiment is able to write data directly without erasing existing data when writing data. The mask ROM array 102 is a storage area that has characteristics of a mask ROM for which data written during the manufacturing process cannot be erased or rewritten.

A plurality of data cells (memory cells) that store 1 bit of information typically shown in FIG. 2 are provided in the EEPROM array 101 and the mask ROM array 102 of the memory array 100. With this embodiment, as shown in FIG. 2, the memory array 100 has 8 addresses (address of 8 bits of data) provided in 1 row as the specified address unit, and for example in the EEPROM array 101, 8 data cells (8 bits) are arranged in 1 row and 16 data cells (16 words) are arranged in 1 column, so it is possible to store 8×16 bits (128 bits) of data. In the mask ROM array 102 are arranged 8 data cells (8 bits) in 1 row and 8 data cells (8 words) in 1 column, so it is possible to store 8×8 bits (64 bits) of data.

As shown in FIG. 3, the data written to the memory array 100 for this embodiment has identification information (ID0 to ID2) in the leading 3 bits and has write/read control information for instructing whether to write or read in the 4th bit from the lead. From the 5th bit from the lead and thereafter, there are 16 bits (D15 to D0) of write data in sequence from the most significant bit (MSB). Specifically, the write data for this embodiment is data of the bit length that can be stored in 1 row by the memory array 100, specifically, the data length of 2 times the 8 bits.

The address map of the memory array 100 will be described while referring to FIG. 2. The memory array 100 of this embodiment is equipped with the EEPROM array 101 and the mask ROM array 102 as described previously. In the leading 3 addresses of the EEPROM array 101 (A0 to A2 columns of the 1st row, 3 bits), identification information (ID information) for identifying each semiconductor memory device is stored. Writing to the 1st row containing the leading 3 addresses is prohibited, and for example, it is not possible to rewrite after factory shipping.

With the example in FIG. 2, under fixed conditions, 16 bits of rewritable information are stored in the 9th address (08H) to 16th address (0FH) and the 17th address (10H) to 24th address (07H) of the EEPROM array 101. In FIG. 3, write data (D15 to D0) is stored in each of these addresses so as to be noted correlated to each address (08H to 17H). Specifically, the 8 bits of data D15 to D8 are written to the 1st line (08H to 0FH), and D7 to D0 data are written to the 2nd line (10H to 17H). Note that with this embodiment, the row constituted by this 9th address (08H) to 16th address (0FH) and 17th address (10H) to 24th address (17H) may be called the write restricted row, or each of the 8 addresses of this 9th address to 16th address and 17th address to 24th address may be called a specified address unit. Also, the fixed condition, can be, for example, when the stored information is information related to ink consumption volume, cases when the value of the written data is greater than the value of the existing data, or alternatively, when the stored information is information related to the remaining ink volume, cases when the value of the written data is less than the value of the existing data.

From the 25th address and thereafter of the EEPROM array 101 is a read-only area for which write is prohibited, and, for example, rewriting cannot be done after factory shipping.

The mask ROM array 102 has information (data) written during manufacturing of the memory array, and after the memory array manufacturing, it is not possible to execute writing even before factory shipping.

The memory array 100 for this embodiment is equipped with a plurality of rows that have 8 bits as a unit as described above, but each row is not realized by independent data cell columns, that is to say, rather, one data cell column is realized by bending using 8-bit units. Specifically, for convenience, this is nothing more than calling the row containing the 9th bit the 2nd byte, and calling the row containing the 17th bit the 3rd byte. As a result, to access the desired address in the memory array 100, it is necessary to do sequential access from the start, to do access using so-called sequential access, and it is not possible to do direct access to the desired address as is possible with the random access method.

A word line and a bit (data) line are connected to each data cell in the memory array 100, and data is written to the data cell by selecting (applying a selection voltage) the corresponding word line (row) and by applying a write voltage to the corresponding bit line. Also, the corresponding word line (row) is selected, the corresponding bit line is connected to the in/out controller 120, and the data (1 or 0) of the data cell is read according to the presence or absence of current detection. Note that with this embodiment, the specified address unit can be the address count (data cell count) for which writing is possible by applying a write voltage to 1 word line.

The column selection circuit 103 has the columns (bit lines) connected to the in/out controller 120 in sequence according to the external clock pulse count counted by the address counter 110. The row selection circuit 104 has a selection voltage applied to the rows (word lines in sequence according to the external clock pulse count counted by the address counter 110. Specifically, with the semiconductor memory device 10 of this embodiment, access to the memory array 100 using the address data is not executed, but instead, access to the desired address is executed according to the clock pulse count counted by the exclusive address counter 110.

The address counter 110 is connected to the reset signal terminal RSTT, the clock signal terminal SCKT, the column selection circuit 103, and the row selection circuit 104. The address counter 110 is reset to the initial value by setting the reset signal input via the reset signal terminal RSTT to 0 (or low), and after the reset signal is set to 1, synchronization is done to the fall of the clock pulse input via the external clock signal terminal SCKT, and the clock pulse count is counted (the count value is incremented). The address counter 110 used for this embodiment is an 8-bit address counter that stores 8 clock pulse counts corresponding to the data cell count (bit count) of 1 row of the memory array 100. Note that the initial value can also be any value as long as it is correlated to the leading position of the memory array 100, and typically, 0 is used as the initial value.

The in/out controller 120 is a circuit for transferring the write data input to the data signal terminal SDAT to the memory array 100, or, for receiving the data read from the memory array 100 and outputting it to the data signal terminal SDAT. The in/out controller 120 is connected to the data signal terminal SDAT, the reset signal terminal RSTT, the memory array 100, and the write/read controller 140, and controls switching of the data transfer direction to the memory array 100 and the data transfer direction (of the signal line connected to the data signal terminal SDAT) to the data signal terminal SDAT according to the request from the write/read controller 140. The 8-bit latch register 170 that temporarily stores write data input from the data signal terminal SDAT is connected to the input signal line from the data signal terminal SDAT to the in/out controller 120.

In the 8-bit latch register 170, the data column (MSB) input via the input signal line from the data signal terminal SDAT is held until it reaches 8 bits, and when 8 bits are gathered, the 8 bits of held data are written to the EEPROM array 101. The 8-bit latch register 170 is a so-called FIFO type shift register, and when the 9th bit of the input data is newly latched, the already latched 1st bit of data is released.

With the in/out controller 120, when power is turned on and during reset, the data transfer direction for the memory array 100 is set to the read direction, and by making the input signal line between the 8-bit latch register 170 and the in/out controller 120 high impedance, data input to the data signal terminal SDAT is prohibited. This state is maintained until a write process request is input from the write/read controller 140. Therefore, after reset signal input, the leading 4 bits of data of the data column input via the data signal terminal SDAT are not written to the memory array 100, and meanwhile, the data stored in the leading 4 bits (of these, the 4th bit is Don't care) of the memory array 100 is sent to the ID comparator 130. As a result, the leading 4 bits of the memory array 100 are in a read-only state.

The ID comparator 130 is connected to the clock signal terminal SCKT, the data signal terminal SDAT, and the reset signal terminal RSTT, and a determination is made of whether or not the identification data included in the input data column input via the data signal terminal SDAT and the identification data stored in the memory array 100 (EEPROM array 101) match. As described previously, the ID comparator 100 fetches the leading 3 bits of data of the operation code input after the reset signal RST is input, specifically, the identification data. The ID comparator 130 has a 3 bit register (not illustrated) that stores the most significant 3 bits of identification data fetched from the memory array 100 via the in/out controller 120, and a determination is made of whether the identification data matches based on whether or not both register values match. When both identification data match, the ID comparator 130 sends the access enable signal EN to the write/read controller 140. The ID comparator 130 clears the register value when the reset signal RST is input (RST=0 or low).

The write/read controller 140 is connected to the in/out controller 120, the ID comparator 130, the increment controller 150, the charge pump circuit 160, the clock signal terminal SCKT, the data signal terminal SDAT, and the reset signal terminal RSTT. The write/read controller 140 is a circuit that confirms the write/read control information (the 4th bit of information subsequent to the 3 bit ID information) input via the data signal terminal SDAT synchronized to the 4th clock signal after inputting of the reset signal RST, and switches the internal operation of the semiconductor memory device 10 to either write or read. In specific terms, the write/read controller 140 analyzes the fetched write/read command when the access enable signal AEN from the ID comparator 130 and the write enable signal WEN1 from the increment controller WEN1 are input. If this is a write command, the write/read controller 140 switches the bus signal line data transfer direction in relation to the in/out controller 120 to the write direction, sends the write enable signal WEN2 that enables writing, and requests generation of a write voltage to the charge pump circuit 160.

With this embodiment, when the write data DI written to the write restricted row is data that has the characteristic of the value increasing (increment), a determination is made of whether or not the write data DI is a value that is greater than the existing data DE already stored in the write restricted row, and when the write data DI is data that has the characteristic of the value decreasing (decrement), by making a determination of whether or not the write data DI is a value less than the existing data DE already stored in the write restricted row, changing of the write data DI or inputting of erroneous data is decreased or prevented. In the former case, this function is provided by the increment controller, and in the latter case, it is provided by the decrement controller. With this embodiment, an example of the former case is described with the description below.

The increment controller 150 is connected via a signal line to the reset signal terminal RSTT, the write/read controller 140, and the charge pump circuit 160. The increment controller 150 is internally equipped with a 4-bit counter 151 and 8-bit internal registers 152 and 153. The increment controller 150 determines whether or not the write data DI written to the write restricted row is a value greater than the existing data DE already stored in the write restricted row, and further realizes a determination (verify, prove) of whether or not the data written to the EEPROM array 101 is written correctly.

The increment controller 150, at the timing of latching of the write data DI to the 8-bit latch register 170, reads the existing data DE from the write restricted row of the EEPROM array 101, and stores this in the internally equipped 8-bit internal register 152. The increment controller 150 compares the read existing data ED with the write data DI input to the 8-bit latch register 170 in 1 bit units, and determines whether or not the write data DI is data of a value greater than the existing data DE. Note that to accelerate the process, it is preferable that the input write data be the MSB.

When the write data DI is data of a value greater than the existing data DE, the increment controller 150 outputs the write enable signal WEN1 to the write/read controller 140. Note that when the write restricted row extends over a plurality of rows, the increment controller 150 outputs the write enable signal WEN1 only when the write data DI for all the write restricted rows is data of a value greater than the existing data DE.

After the write data is written, the increment controller 150 verifies whether or not the data is written correctly, and when the write data is not written correctly, the existing data DE stored in the internally equipped 8-bit internal register 152 is written back to the memory array 100. When verifying the write data, the 4-bit counter 151 equipped in the increment controller 150 receives the internal clock signal from the internal oscillator 162 equipped in the charge pump circuit 160 at an 8-bit delay in relation to the external clock signal from the write standby state and starts counting up. The count value counted up by the 4-bit counter 151 is input to the column selection circuit 103 and the row selection circuit 104, and the just written existing data DE is read.

As described previously, the charge pump circuit 160 is a circuit for supplying the bit line for which the write voltage needed during writing of data to the EEPROM array is selected via the column selection circuit 103 based on the request signal from the write/read controller 140. The charge pump circuit 160 is equipped with an internal oscillator 162 that generates the operating frequency necessary during voltage boosting, and by boosting the voltage obtained via the positive electrode power supply terminal VDDT, generates the necessary write voltage.

Read Process

Figure 4:
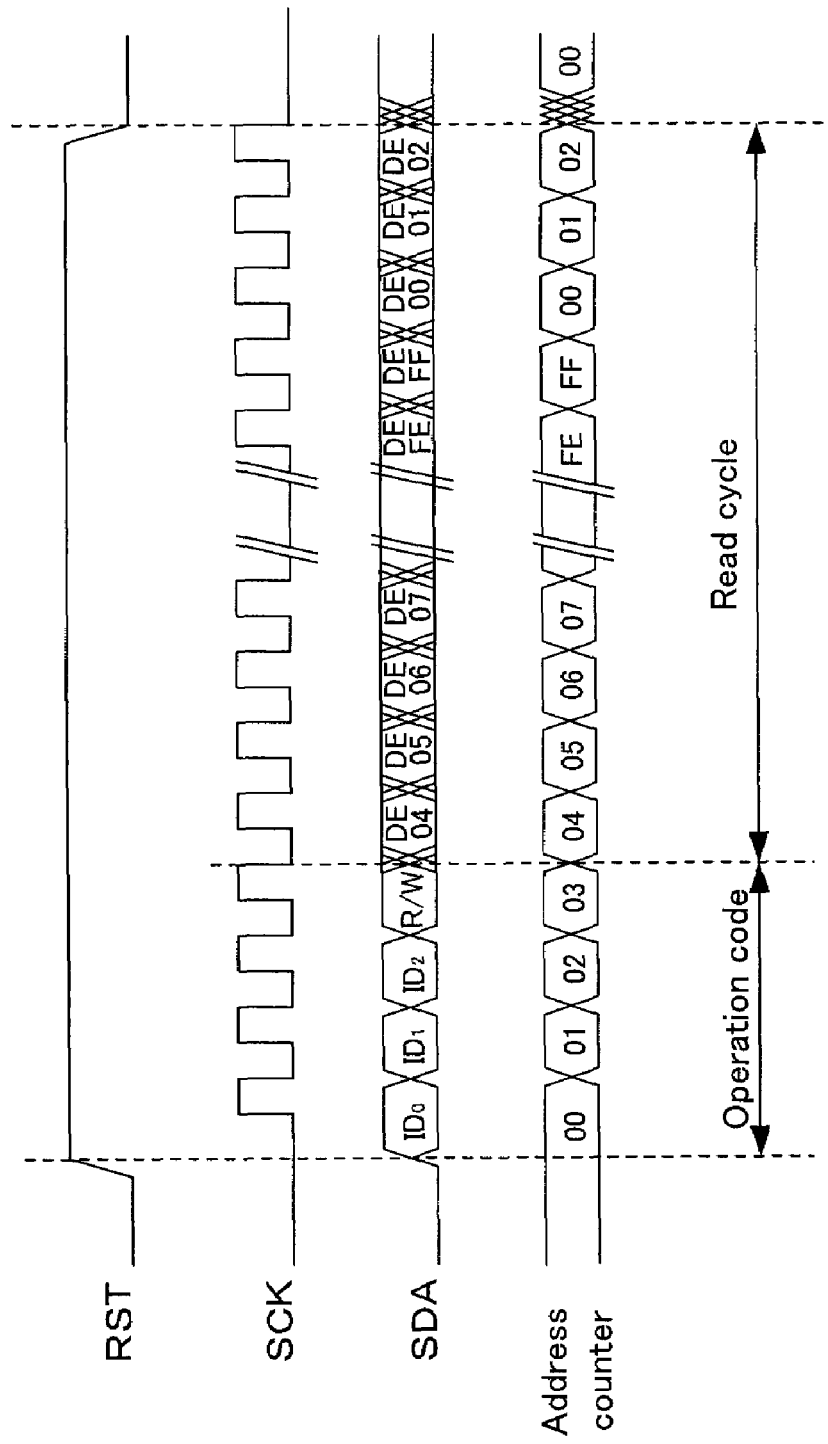
FIG. 4 is a timing chart that shows the time relationship of the reset signal RST, the external clock signal SCK, the data signal SDA, and the address counter value during execution of the read operation.

The reading operation for the semiconductor memory device of this embodiment is described while referring to FIG. 4. FIG. 4 is a timing chart that shows the time relationship of the reset signal RST, the external clock signal SCK, the data signal SDA, and the address counter value during execution of the read operation.

Before the read operation, the identification information confirmation and the read/write command confirmation process will be described based on the operation code. When the reset status (RST=0 or low) is cancelled (RST=1 or high), the data signal SDA containing a 4-bit operation code is synchronized with the external clock signal and input to the data signal terminal SDAT from the host computer (not illustrated). As shown in FIG. 4, the operation code contains the identification information ID0, ID1, and ID2 in the leading 3 bits, and at the 4th bit from the start, contains a command bit for setting to write or read. The identification information comparison is executed as follows.

The ID comparator 130 fetches the data input to the data signal terminal SDAT synchronized with the rising edge of the 3 clock signals SCK after the reset signal RST is switched from low to high, specifically, the 3-bit identification information, and stores it in the 1st 3-bit register. Simultaneous with this, the ID comparator 130 fetches data from the memory array 100 addresses specified by the counter values 00, 01, and 02 of the address counter 110, specifically, fetches the identification information stored in the memory array 100, and stores it in the 2nd 3-bit register.

The ID comparator 130 determines whether or not the identification information stored in the 1st and 2nd registers match, and when the identification information does not match, the high impedance state in the input signal line between the 8-bit latch register 170 and the in/out controller 120 is held by the in/out controller 120. Meanwhile, when the identification information stored in the 1st and 2nd registers match, the ID comparator 130 outputs the access enable signal AEN to the write/read controller 140. Synchronous to the rising edge of the 4th clock signal SCK after the reset signal RST switches from low to high, the write/read controller 140 that has received the access enable signal AEN fetches the command bit sent to the bus signal line and determines whether or not it is a write command. When the fetched command bit is not a write command, the write/read controller 140 outputs a read command to the in/out controller 120.

The in/out controller 120 that has received the read command changes the data transfer direction in relation to the memory array 100 to the read direction, and enables data transfer. The address counter 110 counts up synchronous to the fall of the clock signal SCK, so the counter value of the address counter 110 after input of the operation code is 04, and reading is done from the existing data DE stored in 04H of the memory array 100. The existing data DE stored in the memory array is sequentially output to the data signal terminal SDAT via the in/out controller 120 synchronous to the fall of the clock signal SCK, and the output existing data DE is held during the period until the next fall of the clock signal SCK. When the clock signal SCK falls, the count value of the address counter 110 is incremented by 1, and as a result, the existing data DE stored in the next address (data cell) is output to the data signal terminal SDAT. Repetition of this operation is executed synchronous to the clock signal SCK until the desired address is reached. Specifically, the semiconductor memory device 10 of this embodiment is a sequential access type memory device, so the host computer issues clock signal pulses in a count corresponding to the address requesting read or write, and incrementing must be done until the counter value of the address counter 100 is a count value corresponding to the desired address. As a result, the existing data DE is sequentially read from the address specified by the counter value of the address counter 110 that is sequentially incremented synchronous to the clock signal SCK.

The memory array 100 of the semiconductor memory device 10 of this embodiment does not have the addresses from 00H to BFH, but the address counter 110 executes counting up to address FFH. The addresses from C0H to FFH are a dummy area, and the corresponding addresses do not exist in the memory array 100, and during the time when this dummy area is accessed, the value 0 is output to the data signal terminal SDAT. When up to the address FFH is counted up by the address counter 110, the address returns to the address 00H. After the read operation has ended, the 0 or low reset signal RST is input from the host computer, and the semiconductor memory device 10 is in an operation code receiving standby state.

When the reset signal RST (=0 or low) is input, the address counter 110, the in/out controller 12, the ID comparator 130, the write/read controller 140, and the increment controller 150 are initialized.

Write Process

Figure 5:
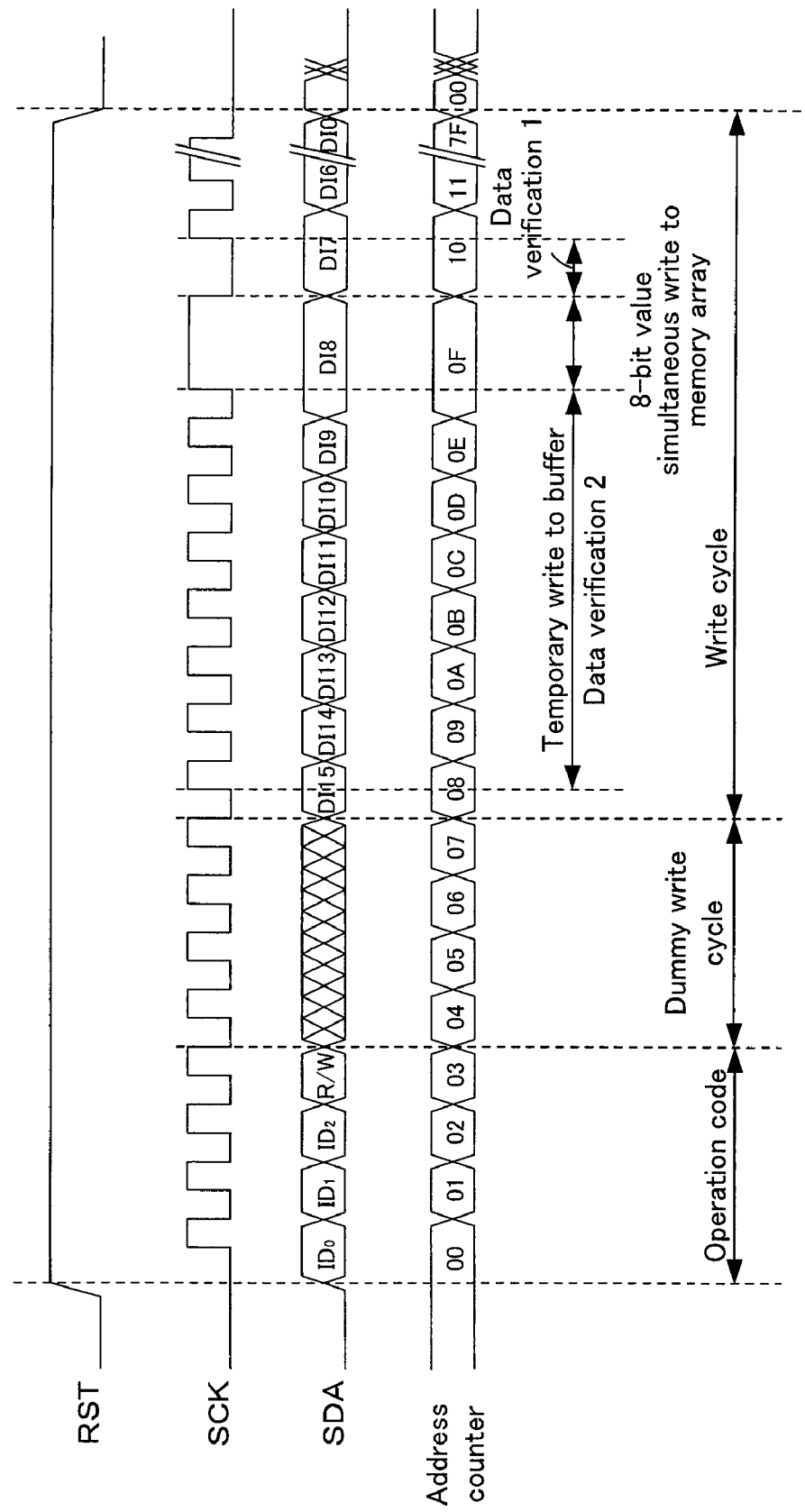
FIG. 5 is a timing chart showing the time relationship of the reset signal RST, the external clock signal SCK, the data signal SDA, and the address counter value during execution of the write operation.

The write operation of the semiconductor memory device 10 of this embodiment will be described while referring to FIG. 5. FIG. 5 is a timing chart showing the time relationship of the reset signal RST, the external clock signal SCK, the data signal SDA, and the address counter value during execution of the write operation. With the semiconductor memory device 10 of this embodiment, writing is executed in row units (8-bit units), specifically, the specified address unit (8 address unit).

After matching of the identification information is confirmed by the ID comparator 130 described previously, when the fetched command bit is a write command, and when the write enable signal WEN1 is received from the increment controller 150, the write/read controller 140 outputs the write enable signal WEN2 to the in/out controller 120.

As shown in FIG. 4, after the operation code is input, 4 clock signals are input as the dummy write clock to the clock signal terminal SCKT, and a write standby state is in effect. The address counter 110 counts up synchronous to the fall of the clock signal SCK, so the counter value of the address counter 110 after the write standby state is 08, and data is written from the address 08H of the memory array 100.

With this embodiment, as described previously, write data of 16-bit length is written to the 1 row, 8-bit memory array 100. During the write process, first, 8 bits of data from the most significant bit (MSB) of the write data DI is sequentially latched to the 8-bit latch register 10 synchronous to the rise of the clock signal SCK. Also, until the write enable signal WEN2 is output to the in/out controller 120, the existing data from the 8th address and thereafter of the memory array 100 is sequentially output onto the data output signal line (data signal terminal SDA) synchronous to the fall of the clock signal SCK. The existing data DE output onto the data output signal line is input to the increment controller 150, and together with the write data DI latched to the 8-bit latch register 170, as described previously, is used to determine whether or not the write data DI in the increment controller 150 is a value greater than the existing data DE. This determination process is executed after the rise of the 8th cycle clock signal SCK (=1 or high) after the write standby state.

The in/out controller 120 that received the write enable signal WEN2 changes the data transfer direction in relation to the memory array 100 to the write direction, cancels the high impedance setting of the signal line between the 8-bit latch register 170 and the in/out controller, and enables data transfer. As a result, the value (0 or 1) of the write data DI is transferred to each bit line of the memory array 100. The write/read controller 140 requests generation of a write voltage to the charge pump circuit 160 after the rise of the 8th cycle clock signal SCK after the write standby state, and the generated write voltage is applied to the bit lines selected by the column selection circuit 103, with this embodiment, all the bit lines, and as a result, the 8 bits of data 1 and 0 stored in the 8-bit latch register 170 are written to the write restricted row once.

When the 8th cycle clock signal SCK falls, the count value of the address counter 100 is incremented by 1, and fetching of the write data DI2 (2nd byte of data) to be written to the next address (8 addresses) is executed. Also, the process of verifying (1st data verification process) whether or not the just written existing data DE and the write data DI used for writing match is executed with the clock low period (data verification 1 period) after the fall of the 8th cycle clock signal SCK. Specifically, during the clock low period, the count value for specifying the address of the just written 8 bits of existing data DE by the 4-bit counter 151 equipped in the increment controller 150 is input to the column selection circuit 103 and the row selection circuit 104. As a result, the just written 8 bits of existing data DE are output from the in/out controller 120, and via the in/out controller 120, are stored in the 8-bit internal register 153 equipped in the increment controller 150. The increment controller 150 verifies whether or not the 8 bits of existing data DE stored in the 8-bit internal register 153 and the 8 bits of write data DI stored in the 8-bit latch register 170 match.

Alternatively, the process of verifying (2nd data verification process) whether or not the just written existing data DE and the write data DI used for writing match may also be executed at the timing when each bit of the 2nd byte write data DI2 is latched to the 8-bit latch register 170 (data verification 2 period). In specific terms, the increment controller 150 fetches the 1 bit of write data DI1$n$ used for the write immediately prior to the release from the 8-bit latch register at the timing when each bit of the 2nd byte write data DI2 is latched to the 8-bit latch register 170, and reads the just written existing data DE1$n$ from the MSB using 1-bit units from the 1st write restricted row of the memory array 100. The increment controller 150 verifies whether or not the fetched write data DI1$n$ and the read existing data DE1$n$ match. By repeating this bit unit comparison process 8 times (data verification 2 period), it is possible to determine whether or not the 1st byte of write data DI1 is correctly written to the 1st write restricted row.

With this embodiment, as shown in FIG. 3, the write data DI is data of 16 bit length, and the write restricted row is 2 rows (8 addresses×2) of the 1st write restricted row and the 2nd write restricted row, so when the process noted above is executed twice, the writing of the write data DI is completed. After writing of the write data DI is completed, the reset signal RST (=0 or low) is input from the host computer to the reset signal terminal RSTT, the operation code receive standby state is in effect, and the write process ends.

Note that the write data sent from the host computer, except for the data corresponding to the address for which rewrite is requested, has the same value (0 or 1) as the data currently stored in the memory array 100. Specifically, the data of the address that cannot be rewritten in the memory array 100 is overwritten using the same value.

When the reset signal RST (=0 or low) is input, the address counter 110, the in/out controller 120, the ID comparator 130, the write/read controller 140, and the increment controller 150 are initialized.

1st Data Verification Process

Figure 6:
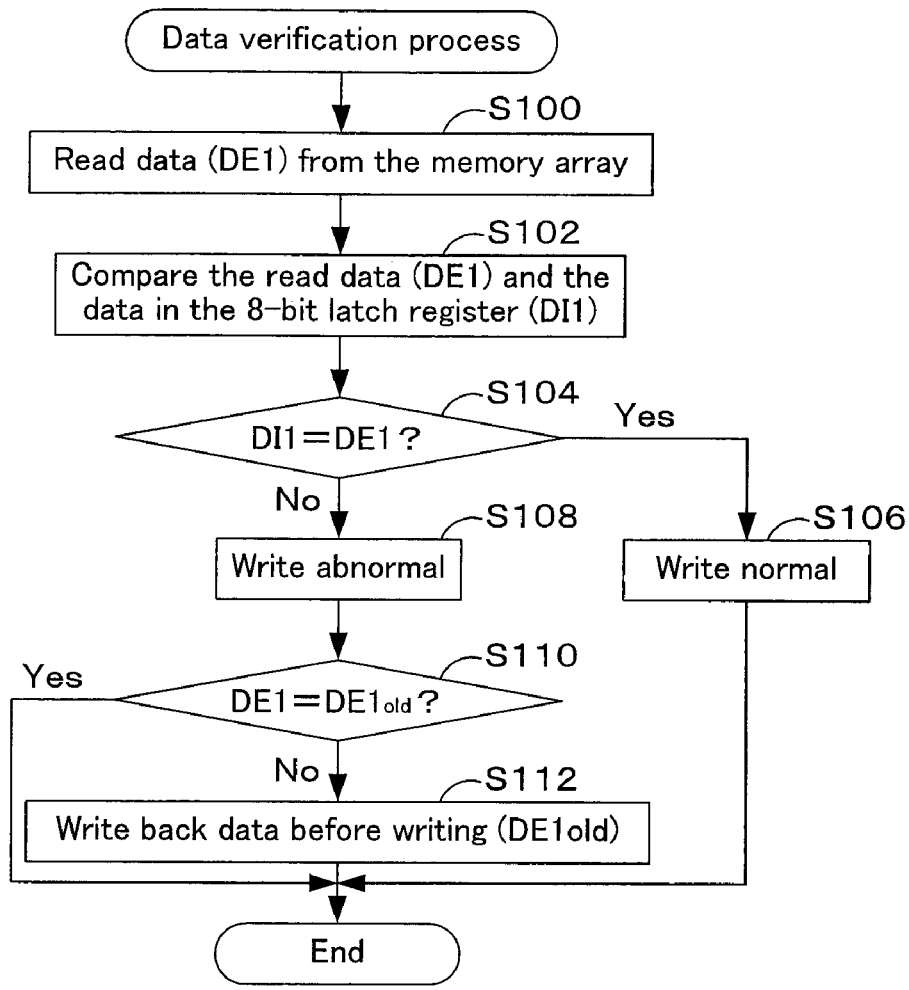
FIG. 6 is a flow chart showing the process routine of the 1st data verification process for the write process executed by the semiconductor memory device of the first embodiment.

The 1st data verification process executed by the semiconductor memory device 10 for this embodiment is described while referring to FIG. 6. FIG. 6 is a flow chart showing the process routine of the 1st data verification process for the write process executed by the semiconductor memory device 10 of this embodiment.

The increment controller 150 reads the just written existing data DE1 from the 1st write restricted row of the memory array 100 (step S100), and compares it with the write data DI1 stored in the 8-bit latch register 170 (step S102). In specific terms, during the clock low period after the 1st byte write ends, the increment controller 150 uses the internal clock signal generated by the internal oscillator 162 of the charge pump circuit 160 and has the 4-bit counter 151 count up. The increment controller 150 inputs the count value of the 4-bit counter 151 to the column selection circuit 103 and the row selection circuit 104, reads the just written 8 bits of existing data DE1 from the 1st write restricted row of the memory array 100 in address sequence via the in/out controller 120, and latches this to the 8-bit internal register 153. Specifically, the internal clock signal is output with an 8-bit (8 clock) delay from the write standby state.

The increment controller 150 determines whether or not the existing data DE1 latched to the 8-bit internal register 153 and the write data DI1 used for writing to the 1st write restricted row latched to the 8-bit latch register 170 match (step S104). When the existing data DE1 stored in the 8-bit internal register 153 read from the 1st write restricted row and the write data DI1 stored in the 8-bit latch register 170 match (step S104: Yes), the increment controller 150 determines that writing was completed correctly (step S106), and ends this processing routine. In this case, the writing process of the 2nd byte write data DI2 to the 2nd write restricted row is executed in the same way as the writing process of the 1st byte write data DI1 to the 1st write restricted row.

When the existing data DE1 latched to the 8-bit internal register 153 read from the 1st write restricted row does not match the write data DI1 stored in the 8-bit latch register 170 (step S104: No), it is determined that the writing was not completed correctly, specifically, that the writing was abnormal (step S108). The increment controller 150 determines whether or not the existing data DE1 latched to the 8-bit internal register 153 read from the 1st write restricted row and the existing data $DE1_{old}$ before writing stored in the 8-bit internal register 152 match (step S110), and when it is determined that $DE1=DE1_{old}$ (step S110: Yes), this processing routine ends. Meanwhile, when it is determined that $DE1 \neq DE1_{old}$ (step S110: No), the increment controller 150 writes the existing data $DE1_{old}$ before writing stored in the 8-bit internal register 152 back to the 1st write restricted row of the memory cell 100 (step S112), and this processing routine ends. When a write abnormality has been determined, the process of writing the remaining write data DI2 to the 2nd write restricted row is not executed.

The writing back process is executed at the write process cycle to the 2nd write restricted row. Specifically, at the 2nd byte write data DI2 write cycle, the existing data $DE1_{old}$ stored in the 8-bit latch is input to the in/out controller 120, and with this the same as the data input via the data signal terminal SDAT, the write process is executed on the 1st write restricted row of the memory array 100. As a result, the data in the 1st and 2nd write restricted rows of the memory array 100 are returned to the values before execution of the write process, so it is at least possible to avoid writing of erroneous data to the memory array 100, and it is possible to increase the reliability of writing of data to the memory array 100.

2nd Data Verification Process

Figure 7:
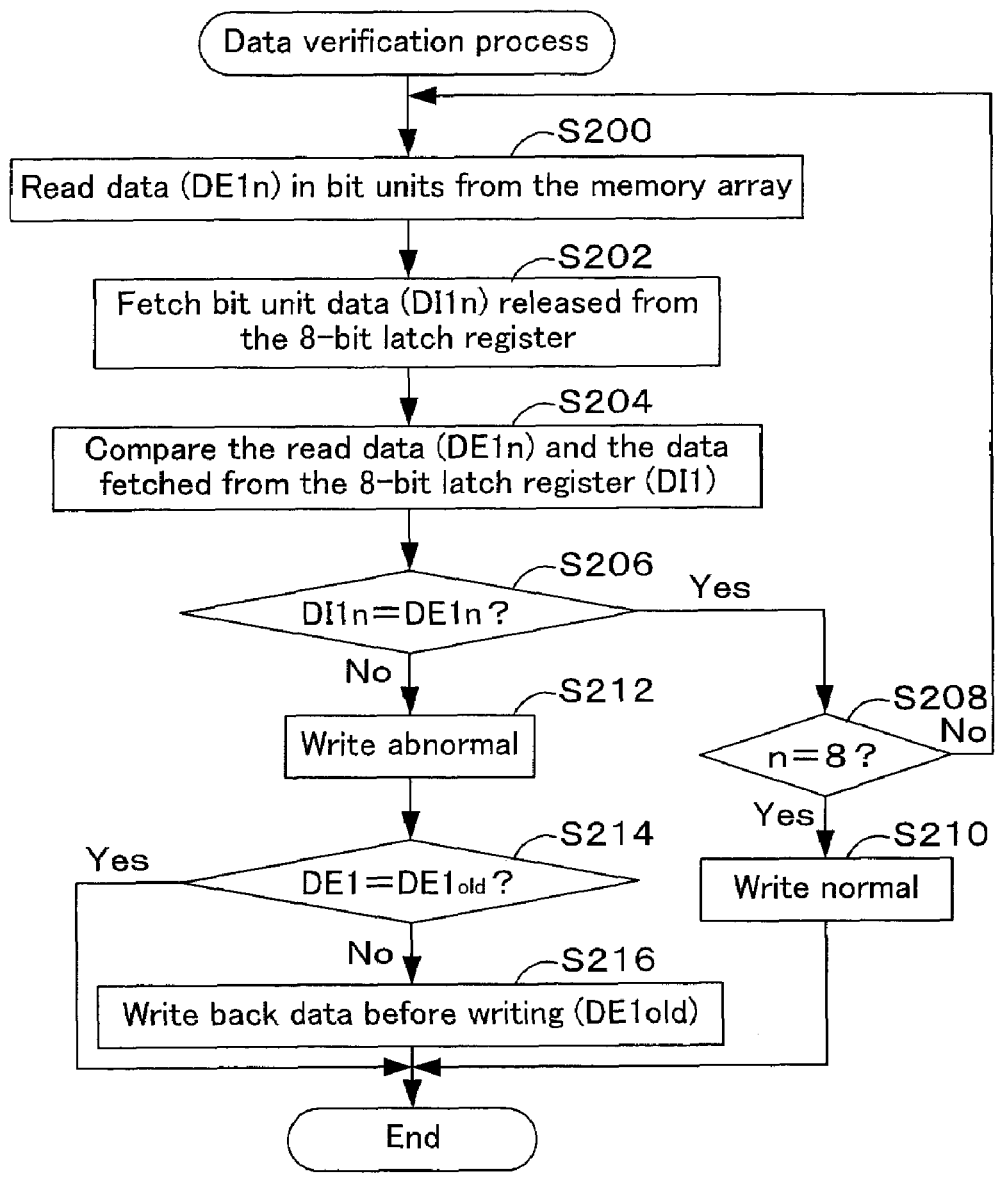
FIG. 7 is a flow chart that shows the processing routine of the 2nd data verification process for the write process executed by the semiconductor memory device of the first embodiment.

The 2nd data verification process executed by the semiconductor memory device 10 of this embodiment is described while referring to FIG. 7. FIG. 7 is a flow chart that shows the processing routine of the 2nd data verification process for the write process executed by the semiconductor memory device 10 of this embodiment.

For the data verification process, instead of the 1st data verification process described previously, it is also possible to have this executed using the 2nd data verification process described below.

The increment controller 150 reads the just written existing data DE1$n$ in bit units from the 1st write restricted row of the memory array 100 (step S200). In specific terms, the increment controller 150 reads 1 bit of the existing data DE1$n$ that constitutes the just written existing data DE1 from the 1st write restricted row of the memory array 100 at the timing when each bit DI2$n$ of the 2nd byte write data DI2 is latched to the 8-bit latch register 170. This reading of the existing data DE1$n$ can, for example, be such that during the verification process (during latching of the 2nd byte write data DI2), the column selection circuit 103 and the row selection circuit 104 subtract 8 counts from the count value input from the address counter 110, and select the read data of the memory array 100 using the subtracted count value. Alternatively, it is also possible to have the column selection circuit 103 and the row selection circuit 104 store the read address of 1 cycle prior, and to sequentially select the stored addresses based on the count values input from the address counter 110.

The increment controller 150 fetches the bit unit write data DI1$n$ released from the 8-bit latch register 170 (step S202). In specific terms, the 8-bit latch register 170 is a FIFO type register, so the already latched write data DI1 is released in 1 bit units each time the 2nd byte write data DI2 is latched in 1 bit units. The increment controller 150 sequentially fetches the released 1-bit unit write data DI1$n$.

The increment controller 150 compares the existing data DE1$n$ read from the 1st write restricted row of the memory array 100 and the write data DI1$n$ fetched from the 8-bit latch register 170 (step S204). When the existing data DE1$n$ read from the 1st write restricted row of the memory array 100 and the write data DI1$n$ fetched from the 8-bit latch register 170 match (step S206: Yes), the increment controller 150 determines whether or not 8 bits of existing data DE1$n$ were read from the 1st write restricted row of the memory array 100, specifically, whether or not n=8 (step S208). When the increment controller 150 determines that n does not equal 8 (step S208: No), the steps S200 to S206 are executed again. Specifically, with the 2nd data verification process, a comparison is performed of the existing data DE1$n$ and the write data DI1$n$ in 1 bit units each time the 2nd byte write data DI2 is stored in the 8-bit latch register 170. Therefore, to verify all of the 8 bits of existing data DE1 stored in the 1st write restricted row of the memory array 100, it is necessary to execute the comparison process 8 times.

When the increment controller 150 determines that n=8 (step S208: Yes), it determines that the writing to the 1st write restricted row of the memory array 100 was completed correctly (step S210), and this processing routine ends. In this case, the process of writing the 2nd byte write data DI2 to the 2nd write restricted row is executed in the same way as the process of writing the 1st byte write data DI1 to the 1st write restricted row.

When the existing data DE1n read from the 1st write restricted row of the memory array 100 and the write data DI1n fetched from the 8-bit latch register 170 do not match (step S206: No), the increment controller 150 determines that the writing was not completed correctly, specifically, that write was abnormal (step S212). When the increment controller 150 makes a determination of whether or not the 8 bits of existing data DE1 latched to the 8-bit internal register 153 read from the 1st write restricted row and the immediately prior 8 bits of existing data $DE1_{old}$ stored in the 8-bit internal register 152 match (step S214), and when it is determined that $DE1=DE1_{old}$ (step S214: Yes), this processing routine ends. Meanwhile, when it is determined that DE1 does not equal $DE1_{old}$ (step S214: No), the increment controller 150 writes the existing data $DE1_{old}$ before writing stored in the 8-bit internal register 152 back to the 1st write restricted row of the memory cell 100 (step S214), and this processing routine ends. The same as with the 1st data verification process, when it is determined that the write is abnormal, the process of writing the remaining write data DI2 to the 2nd write restricted row is not executed.

The write back process is executed in the same way with the procedure described for the 1st data verification process.

Figure 8:
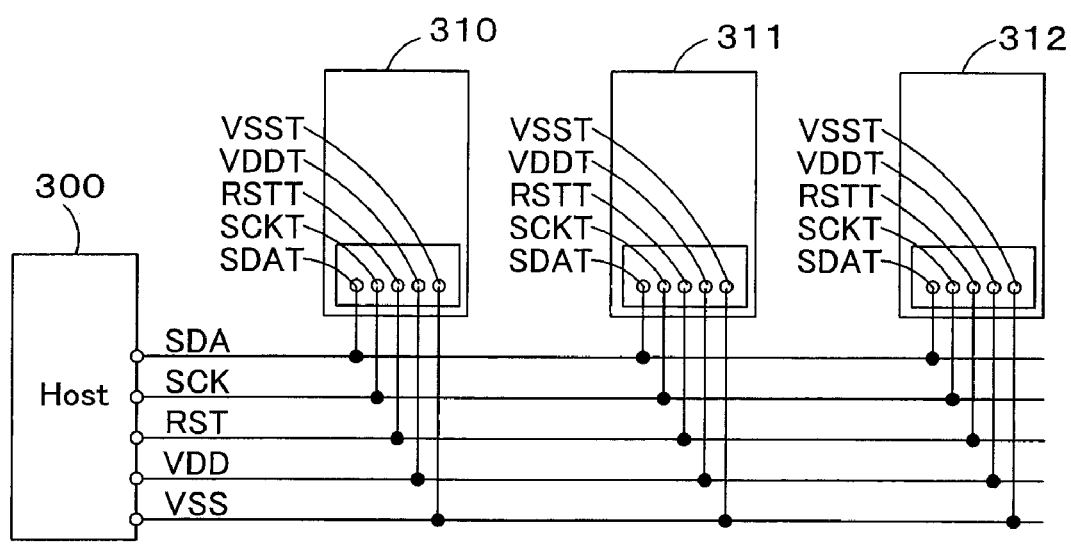
FIG. 8 is an explanatory drawing showing an application example of the semiconductor memory device of the first embodiment.

An application example of the semiconductor memory device 10 of this embodiment will be described while referring to FIG. 8. FIG. 8 is an explanatory drawing showing an application example of the semiconductor memory device of this embodiment. The semiconductor memory device 10 of this embodiment is equipped with receptor units that house consumer goods, for example the ink receptors 310, 311, and 312 that house ink as the print recording material. When each of the ink receptors 310, 311, and 312 is mounted on the printing device, a bus connection is made with the host computer 300 provided in the printing device. Specifically, the data signal line SDA, the clock signal line SCK, the reset signal line RST, the positive electrode power supply line VDD, and the negative electrode power supply line VSS from the host computer 300 are connected with the semiconductor memory device 10 provided with each ink receptor 310, 311, and 312. With this application example, the volume information relating to the ink which is the ink remaining volume or the ink consumption volume is stored in the semiconductor memory device 10.

As described above, with the semiconductor memory device of this embodiment, when write data DI of 2 times the data length of the data length (8 bits) that can be stored in 1 row of the memory array 100 that the semiconductor memory device 10 has is written, a verification is done of whether or not the upper (leading) 8 bits (DI1) of the write data DI are correctly written. Therefore, by executing writing of the lower (remaining) 8 bits (DI2) only when the first 8 bits (DI1) of the write data DI are written correctly, it is possible to increase the reliability of writing of data of data lengths longer than the data length that can be stored in 1 row of the memory array 100. Specifically, as long as the upper 8 bits (DI1) of the write data DI are not written correctly, overwriting (updating) of the existing data DE is not executed, so it is possible to increase the reliability of data writing.

In particular, with the embodiment noted above, storage to the starting side address is done from the most significant bit (MSB) to the memory array 100 that the semiconductor memory device 10 has, so there is no erroneous writing of the upper digits expressed by the upper 8 bits, and it is possible to increase the reliability of writing the write data.

It is also possible to increase the reliability of writing data of a data length longer than the data length that can be stored in 1 row of the memory array 100, so the semiconductor memory device 10 of this embodiment is able to share write data lengths of integral multiples of the data length that can be stored in 1 row of the memory array 100 for a plurality of devices.

With the 1st verification process, the verification process is executed in 8-bit units, so it is possible to do consolidated execution of the verification process, and compared to when executing the verification process using 1-bit units, it is possible to shorten the time required for verification processing.

Furthermore, with the 2nd verification process, it is possible to execute verification processing without using the circuits including the 4-bit counter and the internal oscillator 162. Specifically, with the 1st verification process, verification processing is executed using 8-bit units, but with the 2nd verification process, this is executed using 1-bit units. In this case, the increment controller 150 does not need to be equipped with the 4-bit counter 151 and the 8-bit internal register 153, and it is possible to simplify the circuit configuration.

Other Embodiments for the Fist Embodiment (1) With the embodiment noted above, when as a result of the verification process, the 1st byte write data DI1 is not written correctly to the 1st write restricted row, the existing data $DE1_{old}$ before writing latched to the 8-bit internal register 152 is written back to the 1st write restricted row, but it is also possible not to execute writing back. Even in this case, writing of the 2nd byte write data DI2 to the 2nd write restricted row is not executed, and it is guaranteed that the value of the lower 8 bits will be correctly written values. Meanwhile, for the values of the upper 8 bits, typically, these are values that do not change significantly during a short time, so by verifying the certainty with the previous value on the host computer side, it is possible to avoid problems.

(2) With the embodiment noted above, an example of 16 bit length write data was described, but in addition to this, it is also possible to use this in the same way on data having a data length that is a multiple of the bit length of 1 row of the memory array 100 such as 24 bit length or 32 bit length, and it is also possible to obtain the same effects. In this case, the verification process is executed in 1-byte units (8-bit units) until the final 1 byte is written.

(3) With the embodiment noted above, the verification process is not executed for the 2nd byte write data DI2, but it is also possible to execute the verification process on the 2nd byte write data DI2.

(4) With the embodiment noted above, an ink cartridge was used as the application example, but in addition to this, it is also possible to obtain the same effects for a toner cartridge as well. It is also possible to obtain the same effect when using this for a medium for storing money equivalent information such as a prepaid card, etc.

Second Embodiment

Structure of the Semiconductor Memory Device

A semiconductor memory device according to a second embodiment is a EEPROM that stores information in a non-volatile manner and that is accessed sequentially from a starting address in 1-bit units.

Figure 9:
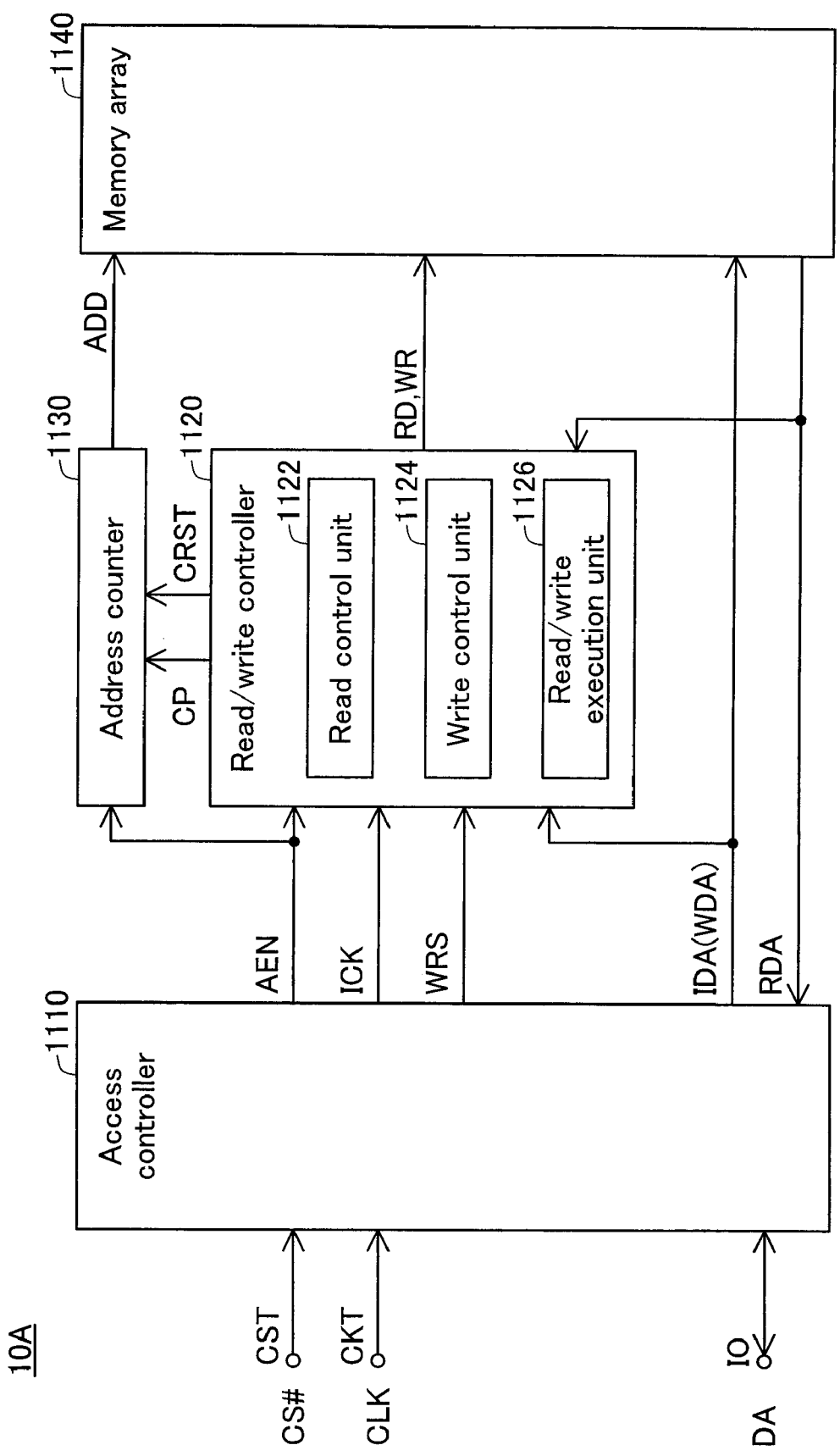
FIG. 9 is a block diagram illustrating the internal circuit structure of a semiconductor memory device according to a second embodiment.

FIG. 9 is a block diagram illustrating the internal circuit structure of a semiconductor memory device according to the second embodiment. This semiconductor memory device 10A has an access controller 1110, a read/write controller 1120, an address counter 1130, and a memory array 1140.

The memory array 1140 has a memory area of a specific memory capacity, for example, 256 bits.

The address counter 1130 is a circuit that increments the counter value synchronized with a clock signal CLK that is inputted into a clock signal terminal CKT. More specifically, the address counter 1130 is a circuit that increments (counts-up) the counter value, synchronized with the count-up signal CP that is outputted from the read/write controller 1120. Note that the count-up signal CP is a clock signal that is outputted from the read/write controller 1120, and corresponds to the internal clock signal ICK. Moreover, the internal clock signal ICK is a clock signal that is outputted from the controller 1110, corresponding to the clock signal CLK. Consequently, the count-up signal CP is a clock signal corresponding to the clock signal CLK, where the address counter 1130 counts up the counter value synchronized with the clock signal CLK.

The counter value of the address counter 1130 is inputted into the memory array 1140 as the address ADD indicating a 256-bit memory area of the memory array 1140, where the location for writing, or location for reading, in the memory array 1140 is specified by the counter value of the address counter 1130.

The address counter 1130 is reset to the initial counter value when the counter reset signal CRST is inputted. Here the initial value need not necessarily be a value with any specific relationship to the starting position of the memory array 1140, and typically "0" is used as the initial value. Note that the counter reset signal CRST is outputted from the read/write controller 1120 at the beginning or the end of accessing (that is, at the beginning or end of reading or writing data), or when initializing the device.

Consequently, the address counter 1130 is able to specify sequential write locations or read locations in the memory array 1140 through the counter value that counts up sequentially from the initial value.

The access controller 1110 is connected to a chip select terminal CST, a clock signal terminal CKT and a data signal terminal IO, where the chip select signal CS# is inputted through the chip select terminal CKT, a clock signal CLK is inputted through the clock signal terminal CKT, and data signal DA is inputted or outputted through a data signal terminal IO. The clock signal CLK that has been inputted is sent to the read/write controller 1120 as the internal clock signal ICK. The data signal DA, if an input data signal, is sent to the read/write controller 1120 as the input data signal IDA, and send to the memory array 1140 as a write data signal WDA. If the data signal DA is an output data signal, then the read data signal RDA that is sent from the memory array 1140 is outputted as the data signal DA.

Moreover, the access controller 1110 controls the starting and stopping of access based on the chip select signal CS#, and the data signal DA that is inputted synchronized with the clock signal CLK. Specifically, when the chip select signal CS# is inputted and the command data that specifies either reading or writing data is inputted as the data signal DA, with timing that was established in advance, the access controller 1110 outputs the access enable signal AEN to the read/write controller 1120 and address counter 1130, and if the access that is specified is write access, the access controller 1110 controls the start of accessing by outputting a write access start signal WRS to the read/write controller 1120. Moreover, when the chip select signal CS# input has been terminated, the access controller 1110 terminates sending of the access control signal AEN, and if a write access start signal WRS is sent, the access is terminated by the termination of the transmission of this signal.

The read/write controller 1120 is provided with a read control unit 1122 that controls the data reading, a write control unit 1124 that controls the data writing, and a read/write execution unit 1126 that sends, to the memory array 1140, a read execution signal RD according to the instruction from the read control unit 1122 and that sends to the memory array 1140 a read execution instruction RD and a write execution instruction WR following the instructions received from the write control unit 1124, and executes control when data is read or written. Specifically, of the access enable signal AEN and the write start signal WRS from the access controller 1110, if only the AEN is received, then the read control unit 1122 and the read/write execution unit 1126 are actuated, and a read execute signal RD is sent to the memory array 1140, synchronized with the falling edge (rising edge) of the internal clock signal ICK to perform the process for reading the data. At this time, the read data included in the read data signal RDA from the memory array 1140 (termed simply "read data RDA") is inputted into the access controller 1110, and outputted through the data signal terminal 10 as the output data signal DA. Moreover, when an access enable signal AEN and a write access write signal WRS are inputted from the access controller 1110, the write control unit 1124 and the read/write execution unit 1126 are actuated and a read execute signal RD is sent to the memory array 1140 synchronized with the falling edge (rising edge) of the internal clock signal ICK, while a write execute signal WR is outputted to the memory array 1140 synchronized with the rising edge (falling edge) of the internal clock signal ICK, and the data read out and data writing processes, described below, are performed. At this time, the data signal DA that is inputted into the access controller 1110 through the data signal terminal 10 is sent to the memory array 1140 as the write data signal WDA, and the data that indicates the write data signal WDA (termed simply the "write data WDA") is written in the order in which it was inputted into the memory array 1140.

Note that a distinctive feature of the semiconductor memory device according to the present embodiment is the aspect that the data writing operation is by the write control unit 1124, and because, when it comes to the aspect wherein the data readout operation is through the read control unit 1122 is identical to that which is in the conventional semiconductor memory device, and so further explanations will be made below regarding the data write operations.

Write Operation:

As the prerequisites, it is assumed that multibit data, inputted sequentially through the data signal terminal IO as the data signal DA, is inputted one bit at a time beginning with the most significant bit (MSB), where access is performed with the memory area in the memory array 1140 starting with the address that is associated with the most significant bit.

Figure 10:
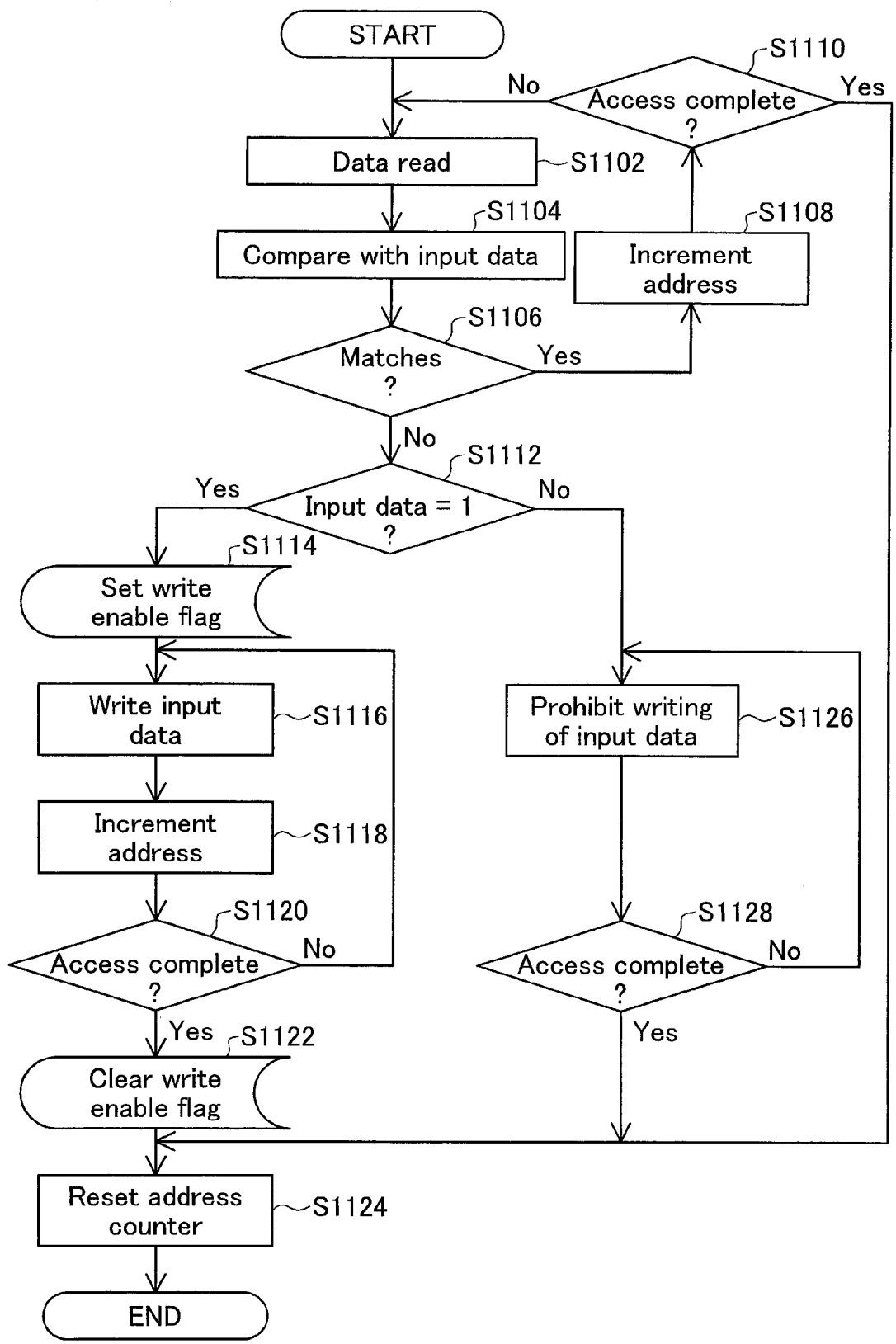
FIG. 10 is a flow chart illustrating the procedure in the data write operation according to the second embodiment.

FIG. 10 is a flow chart showing the sequence of steps for performing the data write operation in the second embodiment. As described above, this operation is able to input the access enable signal AEN into the read/write controller 1120 from the access controller 1110, and, when the write access start signal WRS is inputted, is performed by the write control unit 1124.

When the write operation is started, the write control unit 1124 performs the data reading in the read/write execution unit 1126 (Step S1102). For example, the read/write execution unit 1126 sends a read execute signal RD to the memory array 1140 synchronized with the falling edge of the internal clock signal ICK. At this time, the stored data (stored data) is read out from the memory area at the memory area location corresponding to the address value expressed by the address signal ADD that is outputted from the address counter 1130 of the memory array 1140, in response to the read execute signal RD. Note that the sending of the read execute signal RD is performed synchronized with the falling edge of the internal clock signal ICK, even in the other readout process, which will be described below.

Moreover, the write control unit 1124 compares the data that expresses the readout data signal RDA (hereinafter termed the "readout data") that is sent from the memory array 1140, readout as described above, to the data that expresses the input data signal IDA (termed simply "input data") that is sent from the access controller 1110, inputted through the data signal terminal IO (in Step S1104), and determines whether or not the readout data matches the input data (Step S1106).

If the value of the readout data matches the value of the input data (Step S1106: Yes), then the write control unit 1124 increments the counter value of the address counter 1130 by one (Step S1108), and then judges whether or not the access operation has been completed (Step S1110), and if the access operation is to be continued (Step S1110: No), then, again, the data read out is performed again in the read/write execution unit 1126 (Step S1102). For example, the read/write controller 1120 outputs the count-up signal CP to the counter 1130, synchronized with the next falling edge of the internal clock ICK after the read/write execution unit 1226 sends the read execution signal RD. At this time, the counter value of the counter 1130 is incremented by 1 following the count-up signal CP. Note that the counter 1130 increments the counter value each cycle with each falling edge of the count up signal CP, which corresponds to the internal clock signal ICK (the count-up timing).

Consequently, the write control unit 1124 repeats the data read out process (Step S1102) and the process of comparing with the input data (Step S1104) until the readout data and the read out data stop matching (Step S1106: No).

Note that the write control unit 1124, in determining the end of the aforementioned access operation (Step S1110), resets the counter value of the address counter 1130 (Step S1124) when it is determined that the access operation is to be terminated (Step S1110: Yes), thus completing the write operation. The decision as to whether or not the access operation has been completed can be made based on whether or not the chip select signal #CS or the access enable signal AEN is inputted. Specifically, it can be determined that the access operation has been completed when the signal that is used as the basis for the decision, for example, the access enable signal AEN is in a non-active state.

On the other hand, in the decision as to whether or not the value of the aforementioned readout data matches the value of the input data (Step S1106), if the value of the readout data does not match the value of the input data (Step S1106: No), then the write control unit 1124 determines whether or not the input data value is "1" (Step 1112).

If the value of the input data is "1" (Step S1112: Yes), then the write enable flag is set (Step S1114), and the writing is performed for the input data, as the write data, in the read/write execution unit 1126 (Step S1116). For example, the read/write execution unit 1126 sends the write execute signal WR to the memory array 1140 synchronized with the internal clock signal ICK. At this time, the input data (the write data) is written to the memory area in the memory area position that corresponds to the address value that is indicated by the address signal ADD that is outputted from the address counter 1130, in the memory array 1140.

Moreover, the write control unit 1124 increments, by one, the counter value of the address counter 1130, with the next count up timing (Step S1118), and then determines whether or not the access operation has been completed (Step 1120).

When the access operation is to be continued (Step S1120: No) then the data write process (Step S1116) and the address count up process (Step S1118) are executed again. On the other hand, when the access operation is completed (Step S1120: Yes), the write enable flag setting is cleared (Step S1122), and the counter value for the address counter 1130 is reset (Step S1124) to terminate the write operation.

Moreover, in the decision as to whether or not the aforementioned input data value is "1" (Step S1110), if the determination is that the input data value is not "1" (Step S1110: No), then the write control unit 1124 prohibits the writing of the input data (Step S1126) and stopping the operation of the read/write execution unit 1126 until the access operation is completed (Step S1128: No). On the other hand, if the access operation has been completed (Step S1128: Yes), then the counter value of the address counter 1130 is reset (Step S1124), and the write operation is terminated.

Next a specific example of the aforementioned write operation will be explained. The case of writing 4-bit binary data to a 4-bit memory area will be assumed for convenience in explanation. For example, the data (1010*b*) will be stored to each of the 4-bit memory areas. Note that the "b" in this value indicates that the value in binary data, where of the four "1" or "0" numbers, the one on the furthest left is the "MSB" (most significant bit), and the one furthest to the right is the "LSB" (least significant bit).

For example, when the input data (the write data) "1010b" is inputted sequentially, starting with the most significant bit on the left-hand side, the memory bits corresponding to these bits are compared sequentially. At this time, the input data and the stored data match for each bit, so the data write process is not performed.

Moreover, when the input data "1100b" is inputted, in contrast to the stored data "1010b" the second bit from the left in the input data is a "1," while the stored data value is "0," and so is a mismatch, and the input data value is "1," so the input data value is larger than the value of the stored data. The result is that the write enable flag is set, and "1" is written for the second bit from the left, "0" for the third bit, and "0" for the fourth bit, sequentially, where the data "1010b" that is stored in each of the four-bit memory regions is overwritten with the input data of "1100b".

Moreover, when input data of "1001b" is inputted, then, in relation to the stored data of "1010b," the "0" is the value of the input data that is the third bit from the left, and "1" is the corresponding value in the stored data, and so there is a mismatch; however, the value of the input data is "0," so the value of the input data is less than the value of the stored data. The result is that the write enable flag is not set, but rather the writing of the input data "1001b" is prohibited.

As explained in the above, in the write operation according to the second embodiment, the data is overwritten only when the value of the input data, as the write data, is larger than the value of the stored data, and if the write data is less than the stored data, then writing is prohibited. This makes it possible to prevent writing except for when writing in conformance with data conditions that have been set in advance.

Note that while in the write operation in the second embodiment described above, the input data was not written when the write data matched the stored data, instead the write enable flag may be set to write the input data so that the data writing is prohibited only in the case wherein the write data is smaller than the stored data.

Moreover, while in the write operation in the second embodiment, described above, the explanation was for writing the data sequentially in single-bit units, conversely, the data may be written in n-bit units instead. However, in such a case, there would be the need for a data buffer for holding the input data for each of the bits until all of the n bits of data have been inputted.

However, in the write operation in the second embodiment, the data can be overwritten only when the data condition of "the write data is larger than the stored data" is fulfilled. However, in order to reduce the write execution signal WR generation time, when, for example, the timing of the clock signal CLK, that serves as the reference for generating the write execution signal WR, is changed and the write operation is performed, there is the possibility that data may be written even if the data does not fulfill the data conditions. Given this, a semiconductor memory device according to the present invention that deals with this situation will be described below.

Third Embodiment

Structure of the Semiconductor Memory Device

The semiconductor memory device according to the third embodiment is a EEPROM wherein access is performed sequentially, beginning at a starting address, bitwise, along with storing the memory contents in a non-volatile manner, similar to the case in the second embodiment.

Figure 11:
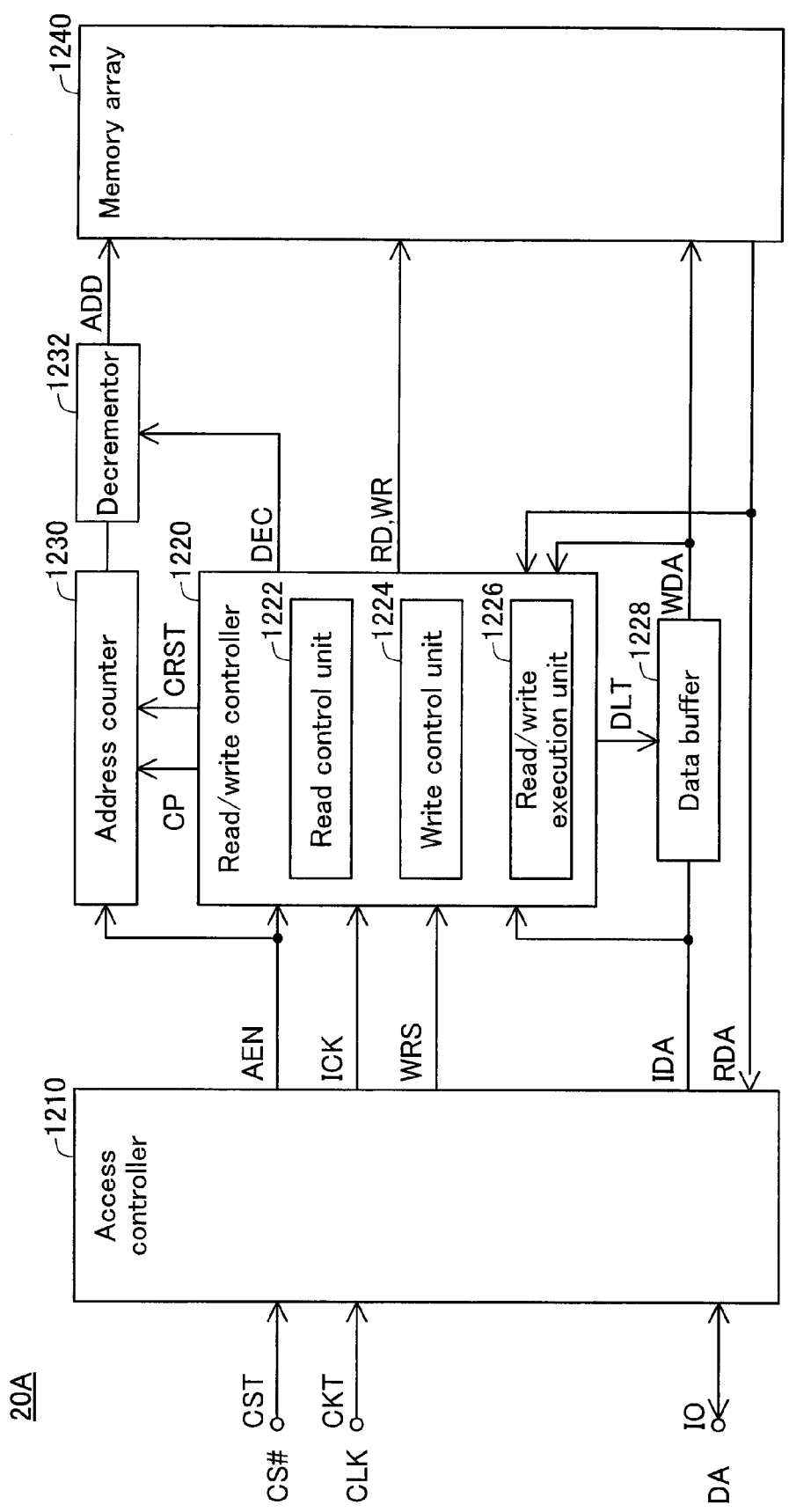
FIG. 11 is a block diagram illustrating the internal circuit structure of a semiconductor memory device according to a third embodiment.

FIG. 11 is a block diagram illustrating the internal circuit structure of the semiconductor memory device according to the third embodiment. This semiconductor memory device 20A is provided with not only an access controller 1210, a read/write controller 1220, an address counter 1230, and a memory array 1240, but also a data buffer 1228 and a subtracter 1232.

The access controller 1210, the address counter 1230, and the memory array 1240 are the same as the access controller 1110, the address counter 1130, and the memory array 1140 in the semiconductor memory device in the second embodiment. (See FIG. 9.)

The data buffer 1228 latches the input data signal IDA, from the access controller 1210, depending on the latch signal DLT that is inputted from the read/write controller 1220, and outputs, to the memory array 1140, the latched data as the write data signal WDA.

The subtracter 1232 sends, to the memory array 1140, an address that indicates the value wherein the counter value has been decremented (hereinafter termed the "decremented address") or the address that is expressed by the counter value of the address counter 1230 (hereinafter termed the "non-decremented address") as the address signal ADD according to the decrement signal DEC from the read/write controller 1220.

The read/write controller 1220 is provided with a read control unit 1222, a write control unit 1224, and a read/write execution unit 1226, and actually controls the access (data reading or data writing) in fundamentally the same manner as the read/write controller 1120 in the second embodiment. The read control unit 1222 and the read/write execution unit 1226 are the same as the read control unit 1122 and the read/write execution unit 1126 in the second embodiment.

The write control unit 1224 controls the operation of the address counter 1230, the read/write execution unit 1226, the data buffer 1228, and the subtracter 1232 to control the data write operation as described below.

Note that the data write operation part through the control of the write control unit 1224 is a distinctive feature in the semiconductor memory device in the present embodiment as well, where, when it comes to the aspect of the data read operation being performed by the read control unit 1122, this aspect is the same as in a conventional semiconductor memory device, so in the below the explanation will be of the data write operation by the write control unit 12.

Write Operations:

As with the case in the write operations in the second embodiment, it is assumed that multibit data, inputted sequentially through the data signal terminal IO, as the data signal DA, is inputted in single-bit units sequentially starting with the most significant bit (the MSB) where the memory area position in the memory array 1240 is accessed at an address from an address for which there is a defined relationship with the most significant bit.

Figure 12:
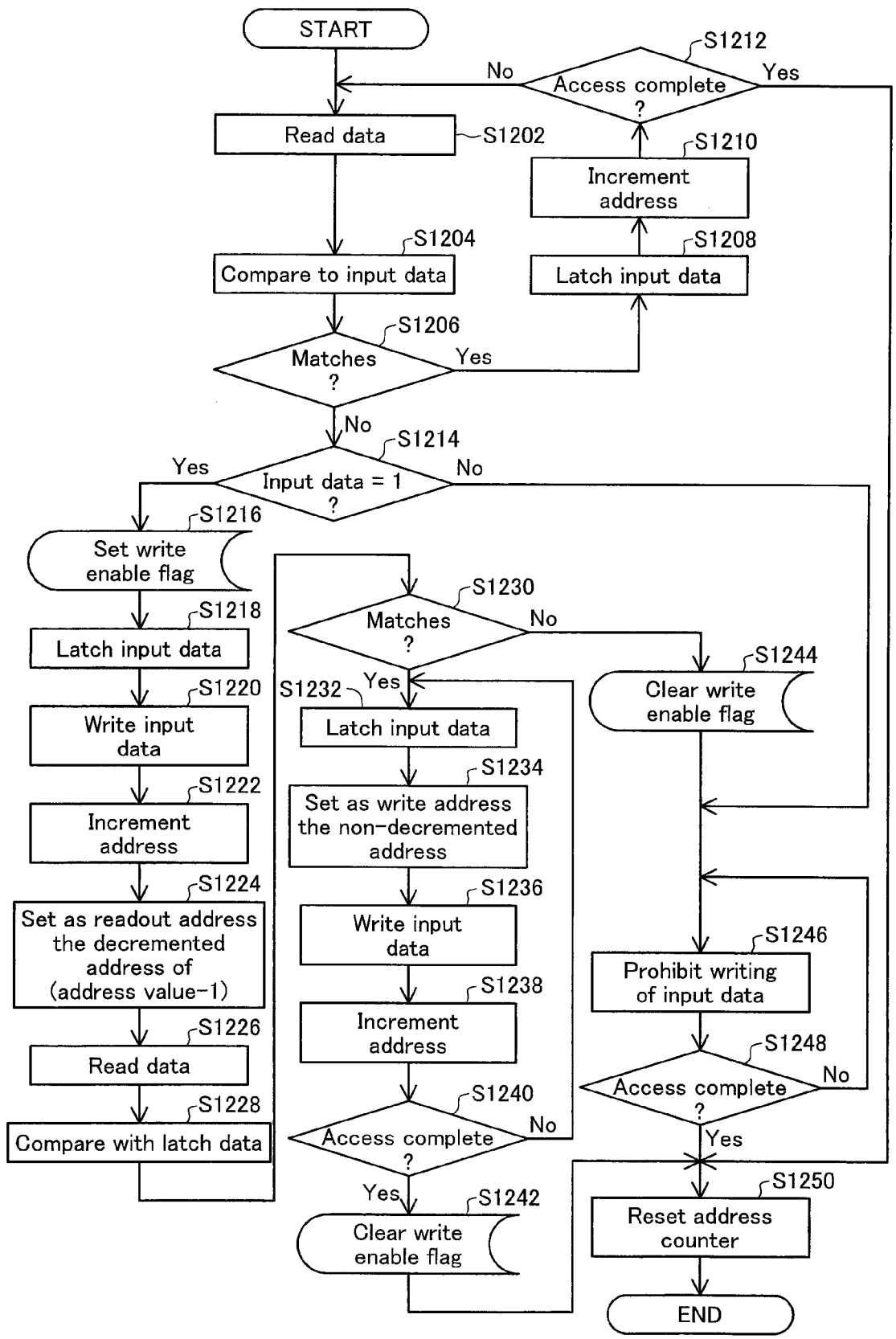
FIG. 12 is a flow chart illustrating the procedure in the data write operation according to the third embodiment.

FIG. 12 is a flow chart illustrating the process in the operation for writing data in the third embodiment. As with the second embodiment, in this operation, when an access enable signal AEN is inputted into the read/write controller 1220 from the access controller 1210 and a write access start signal WRS is inputted, then this operation is executed by the write control unit 1224.

When the write operation is started, the write control unit 1224 executes the data readout in the read/write execution unit 1226 (Step S1202). For example, the read/write execution unit 1226 sends a read execution signal RD to the memory array 1240 synchronized with the falling edge of the internal clock signal ICK. At this time, in accordance with the read execution signal RD, the data that is stored ("stored data") is read out from the memory area, in the memory array 1240, at the memory area position that corresponds to the address value that expresses the address signal ADD that is sent from the address counter 1230. Note that the outputting of the read execution signal RD is performed synchronized with the falling edge of the internal clock signal ICK, both here and in the other readout processes described below.

Moreover, the write control unit 1224 determine whether or not the value of the readout data matches the value of the input data (Step S1206) by comparing the input data to the data that is read out from the memory array 1240, read out as described above (Step S1204).

When the value of the readout data matches the value of the input data (Step S1206: Yes), then the write control unit 1224, after latching the input data in the data buffer 1228 (Step S1208), increments the counter value of the address counter 1230 by 1 (Step 1210), and then determines whether or not the access operation has been completed (Step S1212), and if the access operation is continuing (Step S1212: No), then causes the data readout to be performed again by the read/write execution unit 1126 (Step S1202). For example, the read/write controller 1220 sends a latch signal DLT to the data buffer 1228, synchronized with the rising edge of the internal clock signal ICK, after the read/write execution unit 1226 has send the read execution signal RD. At this time, the data (input data) that expresses the input data signal IDA that is sent from the access controller 1110 is latched in the data buffer 1228 in accordance with the latch signal DLT. Furthermore, the read/write controller 1220 sends, to the counter 1230, a count-up signal CP, synchronized with the next falling edge of the internal clock signal ICK after the read/write execution unit 1226 has sent a latch signal DLT to the data buffer 1228. At this time, the counter value of the counter 1230 is incremented by one in accordance with the count-up signal CP. Note that the data buffer 1228 latches the input data for each cycle with a timing (the latch timing) of the rising edge of each internal clock signal ICK. Moreover, the counter 1230 increments the counter value with each cycle with the timing (the count-up timing) of the falling edge of each of the count-up signals CP, which correspond to the internal clock signal ICK.

Consequently, the write control unit 1224 repeats the data readout process (Step S1202) and the input data comparison process (Step S1204) until the readout data and the input data no longer match (Step S1206: No).

Note that the write signal unit 1224, in determining the conclusion of the aforementioned access operation (Step S1212) resets the counter value of the address counter 1230 (Step S1250) if it is determined that the access operation is completed (Step S1212: Yes), to conclude the write operation. When the access operation is concluded, the decision can be made based on whether or not a chip select signal #CS or an access enable signal AEN is inputted. Specifically, the access operation can be determined to be completed if the signal that is the basis for the decision, for example, the access enable signal AEN, is in an inactive state.

On the other hand, when the write control unit 1224, in determining whether or not the readout data value matches the value of the input data (Step S1206), if the decision is that the value of the readout data does not match the value of the input data (Step S1206: No), then a decision is made whether or not the value of the input data is "1" (Step S1214).

If the value of the input data is "1" (Step S1214: Yes), then the write enable flag is set (Step S1216), and the input data is latched into the data buffer 1228 with the next latch timing (Step S1218), and the data write is executed by the read/write execution unit 1226 (Step S1220). For example, the read/write controller 1220 sends the latch signal DLT to the data buffer 1228, synchronized with the next rising edge of the internal clock signal ICK, after the read/write execution unit 1226 has outputted the read execution signal RD. At this time, the input data is latched into the data buffer 1228 in accordance with the latch signal DLT. Moreover, after the read execution signal RD has been sent, the read/write execution unit sends a write execution signal WR to the memory array 1240 synchronized with the next rising edge of the internal clock signal ICK. At this time, the input data (write data) is written to the memory area of the memory area position, within the memory array 1240, that corresponds to the address value that expresses the address signal ADD that is sent from the address counter 1230.

Moreover, the write control unit 1224 increments, by 1, the counter value of the address counter 1230 with the next address count-up timing (Step S1220).

Next, the write control unit 1224 sets (in Step S1124), as the readout address, an address (the decremented address), that has a value wherein the counter value (the address value) of the address counter 1230 has been decremented by "1," in a subtracter 1232, and causes the read/write execution unit 1226 to execute the data readout (Step S1226).

Moreover, the write control unit 1224 correlates the read data and the write data to compare the data (the latch data) that is latched in the data buffer 1228 (Step S1228) to determined whether or not the value of the readout data matches the value of the latch data (Step S1230).

If the value of the readout data matches the value of the latch data (Step S1230: Yes), then first the input data is latched (Step S1232) in the data buffer 1228 with the next latch timing, and the address with the counter value of the address counter 1230 (the non-decremented address) is set as the write address in the subtracter 1232 (Step 1234) to cause the input data to be written to the read/write execution unit 1126 as the write data (Step S1236).

Moreover, the write control unit 1224 increments the counter value of the address counter 1230 by 1 with the next count-up timing (Step S1238), to determine whether or not the access operation has been completed (Step S1240).

If the access operation is continuing (Step S1240: No), then again the processes from the input data latch process (Step 1232) to the address count-up process (Step 1238) are executed. On the other hand, if the access operation is to be terminated (Step 1240: Yes), then the write enable flag setting is cleared (Step S1242) to reset the counter value of the address counter 1230 (Step S1250) to conclude the write operation.

Moreover, the write control unit 1224, in determining whether or not the value of the aforementioned readout data matches the value of the latch data (Step S1230), clears the write enable flag setting (Step S1244) if the value of the readout data does not match the value of the latch data (Step S1230: No), and prohibits writing of the input data (Step S1246) until the access operation has been completed (Step S1248: No), preventing the operation of the read/write execution unit 1226. On the other hand, when the access operation has been concluded (Step S1248: Yes) then the counter value of the address counter 1230 is reset (Step S1250), concluding the write operation.

Next a specific example of the aforementioned operations will be explained. For convenience in the explanation, it will be assumed that four bits of data will be written to a four-bit memory area. For example, it is assumed that the data "1010b" has been written to each 4-bit memory area. Note that the "b" in this value indicates that the value is binary data, where, of these four 1s or 0s, the one on the left is the most significant bit (MSB) and the one on the right is the least significant bit (LSB).

For example, the input data (the write data) is inputted sequentially starting with the most significant bit on the left edge, and compared sequentially to the corresponding bits in the stored data "1010b." At this time, the value of the input data in the second bit from the left is "1," and the value of the stored data "0" do not match, and the value of the input data is "1," so the value of the input data is larger than the value of the stored data. The result is that the write enable flag is set, and the input data from each bit from the second bit through the fourth bit are read sequentially. Here, after the input data for the second bit from the left has been written, the data that has been written is read out, and if the value of the readout data is "0," then the write data value of "1" has not been written, so the writing of the third bit and fourth bit are prohibited.

As explained in the above, in the write operation in the third embodiment, the input data, as the write data, and the stored data, as the stored data, are compared bitwise sequentially from the most-significant bit to the least significant bit, and when the input data is the larger, then writing is enabled, and after the data has been written for that bit, a check is performed as to whether or not the data has been written correctly. Furthermore, if the writing has not been performed correctly, then the write enable is cancelled, making it possible to prohibit further writing. This makes it possible to strengthen the write protection, beyond that which is in the second embodiment, preventing writing except for under the prescribed data conditions.

Modified Examples of the Write Operation:

Although in the write operation in the aforementioned third embodiment it was explained that the write operation is performed sequentially bitwise, the writing may instead be performed by combining together data of n-bit units (where n is an integer no less than 2).

Figure 13:
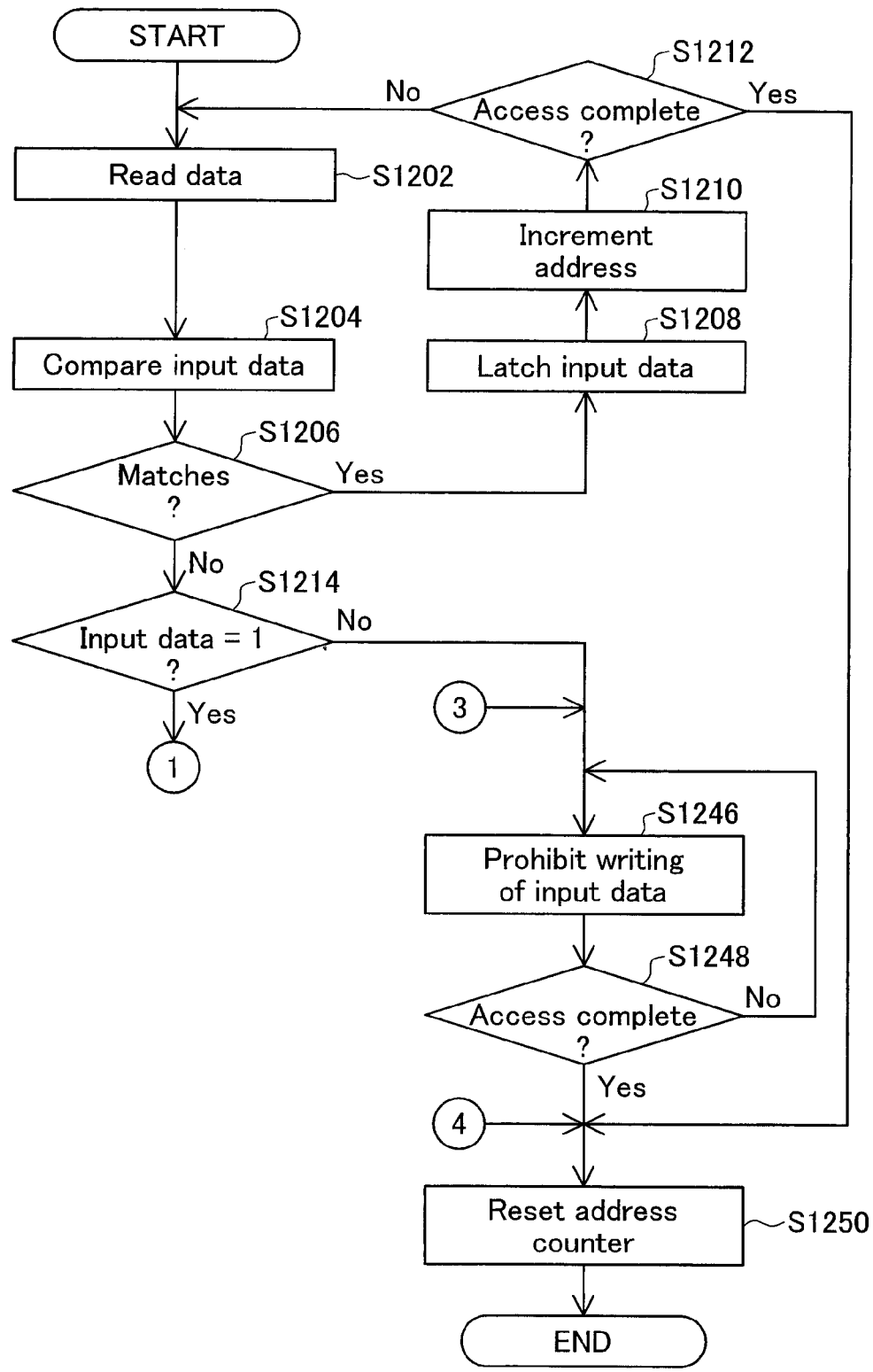
FIG. 13 is a flow chart illustrating the procedure of the data write operation in a modified the third embodiment.
Figure 14:
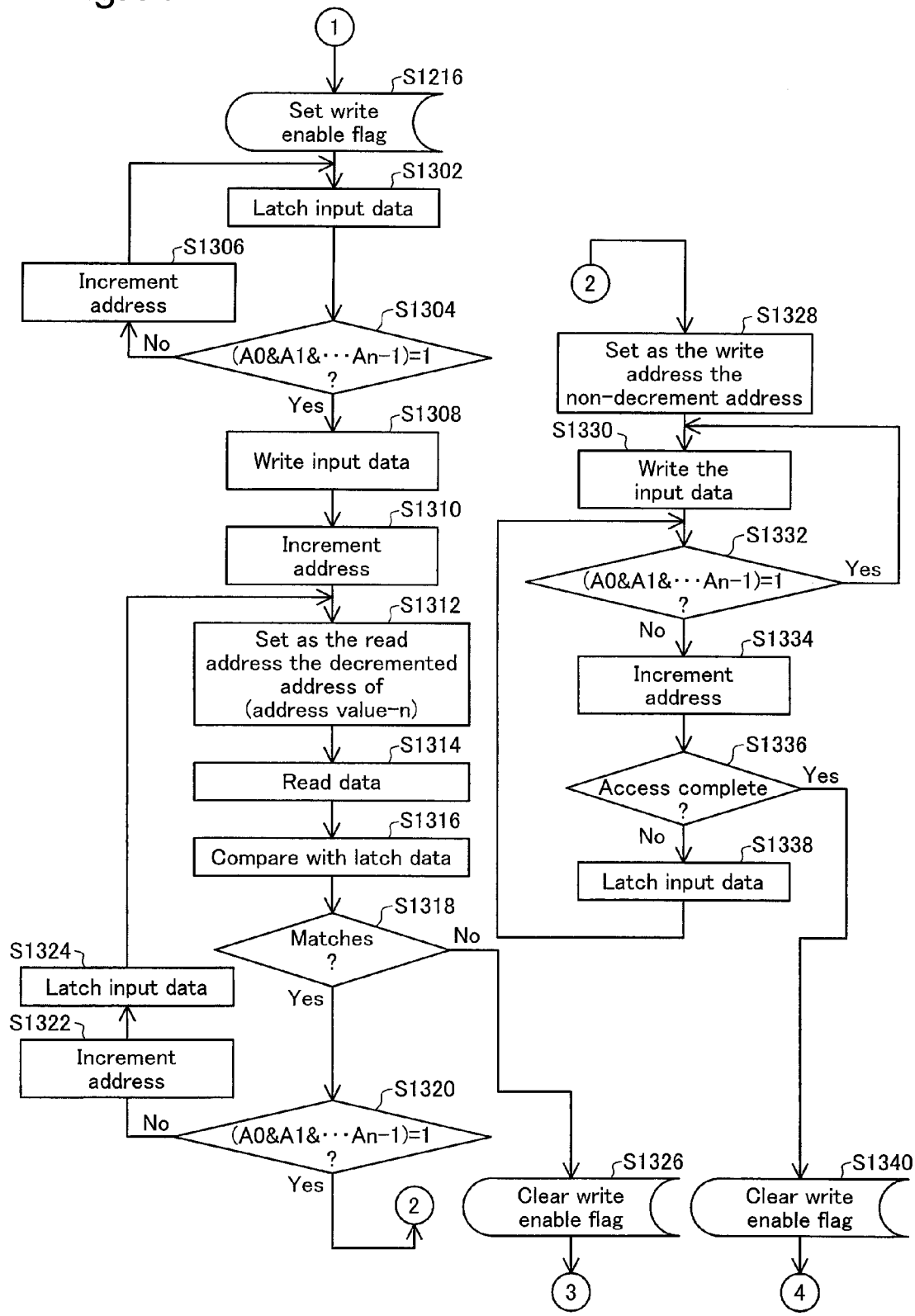
FIG. 14 is a flow chart illustrating the procedure of the data write operation in a modified the third embodiment.

FIG. 13 and FIG. 14 are flow charts illustrating the sequence for the write operations of data in a modified the third embodiment. In these operations, Step S1218 through Step S1244 in the write operation shown in FIG. 12 are modifications of Steps S1302 through S1340, where the processes are the same aside form these points that have been changed. Explanations regarding these changed processes will be described below.

When the write enable flag is set (Step S1216), with each latch timing the write control unit 1224 latches (in Step S1302), into the data buffer 1228, the input data that have been inputted sequentially, until each of the values of the lower n bits (A0, A1, . . . , An–1) of the address that is outputted from the address counter 1230 is "1," (Step S1304: No), and the counter value of the address counter 1230 is incremented sequentially (Step 1306) with each address count-up timing. Moreover, when all of the values of the address of the lower n bits are all "1," (Step S1304: Yes), the read/write execution unit 1226 is caused to execute, all at once, the writing of the latch data for the n bits that are latched in the data buffer 1228 (Step S1308), and then, with the next address count-up timing, the counter value of the address counter 1230 is incremented by one (Step S1310).

Next, the write control unit 1224 sets, as the readout address, a decremented address (Step S1312) wherein the counter value (the address value) from the address counter 1230 is decrement by n, into the subtracter 1232, and causes the read/write execution unit 1226 to perform the data readout (Step S1314).

Moreover, the write control unit 1224 correlates the readout data and the write data, and compares to the data (latch data) that is latched in the data buffer 1228 (Step S1316), to determine whether or not the value of the readout data matches the value of the latch data (Step S1318).

If the value of the readout data does not match the value of the latch data (Step S1318: No), the write enable flag setting is cleared (Step 1326), to prohibit the writing of the input data (Step S1246). On the other hand, if the value of the readout data matches the value of the latch data (Step S1318: Yes), then the address increment process (Step S1322), the input data latch process (Step S1324), the readout address setting process (Step S1312), the data readout process (Step S1314), the latch data comparison process (Step S1316), and the decision process (Step S1318) are repeated until all of the values for the lower n bits of the readout address, outputted from the address counter are "1" (Step S1320: No). On the other hand, when all of the values of the lower n bits of the readout address have gone to "1" (Step S1320: Yes), then a decremented address, expressing the counter value of the address counter 1230 is set as the write address in the subtracter 1232 (Step S1328) to cause the read/write execution unit 1126 to write, all at once, the n bits of latch data that are latched in the data buffer 1228 (Step S1330).

Next, the write control unit 1224 increments the counter value of the address counter 1230 by 1 with each address count-up timing (Step S1334) until each of the bit values for the lower n bits of the write address are "1" (Step S1332: No), and then if the access operation is not complete (Step S1336: No), latches the input data, with the corresponding latch timing (Step S1338). When the value for each bit in the lower n bits of the write address are all "1" (Step S1332: Yes), then the read/write execution unit 1126 is caused to simultaneously write the n bits of latch data that are latched in the data buffer 1228 (Step S1330).

If the access operation is completed (Step S1336: Yes), then the write enable flag setting is cleared (Step S1340), prohibiting the writing of the input data (Step S1246).

In the write operation described above, the n bits of data can all be written together.

Other Embodiments for the Second and Third Embodiments (1) While in the aforementioned second and third examples of embodiment an explanation was given regarding the capacity of the memory array being 256 bits, the present invention is not limited thereto, but rather the capacity of the memory may be modified as appropriate according to the amount of data that must be written.

(2) While in the second and third embodiment, described above, an explanation was given of the case wherein writing is enabled when the write data is larger than the stored data and writing was prohibited when the write data is smaller than the stored data, instead, writing may be enabled when the write data is smaller than the stored data, and writing may be prohibited when the write data is smaller than the stored data.

(3) While in the second and third examples of embodiment an explanation was given regarding the use of a EEPROM as the semiconductor memory device, insofar as the memory device is rewriteable and can maintain the data in a non-volatile state, the present invention is not limited to EEPROMs, but may be another memory device wherein memory is read out or written by a multi-bit unit.

As mentioned above, the semiconductor memory device and the method of controlling writing of the semiconductor memory device of the present invention have been described based on a number of embodiments, but the embodiments of the invention were for making it easy to understand the present invention, and do not limit the present invention. It is also obvious that the present invention may be varied and improved without straying from the key points and the scope of the claims, and the equivalents are included in the present invention.

What is claimed is:

1. A semiconductor memory device, comprising:
a sequentially accessed non-volatile memory array that has a plurality of data storage rows of a specified address unit;
write data holding module that holds write data of a data capacity correlating to n times (n is an integer of 2 or greater) the specified address unit in the specified address units, the data being the write data to be written to the memory array;
data writing module that writes in the specified address unit the held write data to the subject data storage row that is subject to writing in the memory array;
data verification module that determines whether or not the already written data of the specified address unit written to the subject data storage row and the write data of the specified address unit held in the write data holding module match; and
a control unit that, when the already written data and the write data do not match, does not execute writing of the remaining write data to the next data storage row of the subject data storage row using the data writing module.

2. A semiconductor memory device in accordance with claim 1, wherein
when the already written data and the write data match, the control unit executes writing of the write data to the next data storage row of the subject data storage row using the data writing module.

3. A semiconductor memory device in accordance with claim 1, wherein
the data verification module reads the already written data in the address units from the subject data storage row after writing of the write data to the subject data storage row has ended, and
using the already written data read in the specified address unit and the write data of the specified address unit, a determination is made of whether or not the already written data and the write data match.

4. A semiconductor memory device in accordance with claim 1, wherein
the data verification module, after writing of the write data to the subject data storage row has ended, reads the already written data for each 1 address from the subject data storage row and also fetches the write data in 1 address units from the write data holding module, and
using the already written data read in the specified 1 address unit and the fetched 1 address unit write data, a determination is made of whether or not the already written data and the write data match.

5. A semiconductor memory device in accordance with claim 1 further comprising
existing data holding module that holds existing data stored in the subject data storage row before the write data is written; and
a data write back module that writes back the existing data held in the existing data holding module to the subject data storage row when it is determined by the data verification module that the already written data and the write data do not match.

6. A semiconductor memory device in accordance with claim 1, wherein data is stored in the data storage row in sequence from the most significant bit, and
the data write module executes writing of the data in sequence from the most significant bit to the memory array.

7. A semiconductor memory device, comprising:
a sequentially accessed non-volatile memory array that has a plurality of data storage rows having 8 data cells that store 1 bit of data, respectively;
write data holding module that holds in 8-bit units write data to be written to the memory array, holding the write data in multiple n of 8 bits (n is an integer of 2 or greater);
data writing module that writes in 8-bit units the held write data to the subject data storage row that is the subject of writing to the memory array;
data verification module that determines whether or not the 8 bits of already written data written to the subject data storage row and the 8 bits of write data held in the write data holding module match; and
a control unit that, when the already written data and the write data do not match, does not execute writing of the remaining write data to the next data storage row of the subject data storage row.

8. A semiconductor memory device in accordance with claim 7, wherein
when the already written data and the write data do match, the control unit executes writing of the write data to the next data storage row of the subject data storage row using the data writing module.

9. A write control method of writing write data of a data capacity correlating to a multiple n (n is an integer of 2 or greater) of a specified address unit to a semiconductor memory device that has a sequentially accessed non-volatile memory array that has a plurality of data storage rows of a specified address unit, the method comprising:

receiving the write data of the data capacity correlating to n times the specified address unit;
holding in the specified address unit the received write data;
writing in the specified address unit the held write data to the subject data storage row that is subject to write in the memory array;
determining whether or not the already written data of the specified address unit written to the subject data storage row and the held write data of the specified address unit match; and
when the already written data and the write data do not match, not executing writing of the remaining write data to the next data storage row of the subject data storage row.

10. A write control method in accordance with claim 9, wherein
when the already written data and the write data match, executing the writing of write data of the address unit to the next data storage row of the subject data storage row.

11. A write control method in accordance with claim 10 further comprising:
determining whether or not the already written data of the specified address unit written to the next data storage row and the held write data of the specified address unit match; and
when the already written data and the write data do not match, not executing the writing of the remaining write data to the next data storage row of the next data storage row.

12. A write control method of writing write data of a multiple n of 8 bits (n is an integer of 2 or greater) to a semiconductor memory device that has a sequentially accessed non-volatile memory array that has a plurality of data storage rows having 8 data cells that store 1 bit of data, the method comprising:
receiving write data of a data length of the multiple n of 8 bits;
holding in 8-bit units the received write data;
writing in 8-bit units the held write data to the subject data storage row that is the subject of writing to the memory array;
determining whether or not the 8-bit unit already written data written to the subject data storage row and the held 8-bit unit write data match; and
when the already written data and the write data do not match, not executing the writing of the remaining write data to the next data storage row of the subject data storage row.

13. A write control method in accordance with claim 12, wherein
when the already written data and the write data match, executing the writing of the 8-bit unit write data to the next data storage row of the subject data storage row.

14. A write control method in accordance with claim 13 further comprising:
determining whether or not the 8-bit unit already written data written to the next data storage row and the held 8-bit unit write data match, and
when the already written data and the write data do not match, not executing the writing of the remaining write data to the next data storage row of the next data storage row.

15. A semiconductor memory device comprising:
a non-volatile memory array; and
a read/write controller that controls writing data to said memory array and reading data out of said memory array; wherein,
said read/write controller, when a request of writing data to said memory array is received, compares the value of multibit write data that has been inputted to the value of multibit stored data that is stored in a multibit memory area to which said multibit write data is to be written, with said comparison being performed bitwise manner beginning with the largest bit of said multibit write data, then if for the value of each bit of said stored data there is a bit that is determined to fulfill a specific magnitude relationship, writes the write data for the bit that has been so determined, after which checks whether or not the stored data that has been stored in the memory area to which writing has been performed matches said write data for said bit that had been determined, if there is a match, writes the write data of a bit that is after said bit that had been determined, but if there is no match, prohibits the writing of the write data of all bits that are after said bit that had been determined.

16. A semiconductor memory device comprising:
a non-volatile memory array; and
a read/write controller that controls writing data to said memory array and reading data out of said memory array; wherein,
said read/write controller, when a request of writing data to said memory array is received, compares the value of multibit write data that has been inputted to the value of multibit stored data that is stored in a multibit memory area to which said multibit write data is to be written, with said comparison being performed bitwise manner beginning with the largest bit of said multibit write data, if for the value of each bit of said stored data there is a bit that is determined to fulfill a specific magnitude relationship, writes all at once for the write data for the n bits (where n is an integer of 2m, where m is a positive integer) starting with said bit that has been so determined, after which checks whether or not the stored data that has been stored in the memory area to which writing has been performed matches said write data for said bits that had been determined, wherein, if there is a match, writes in n-bit units for the write data of bits starting n bits after said bits that had been determined, but if there is no match, prohibits the writing of the write data of bits starting n bits after said bit that had been determined.

17. A semiconductor memory device in accordance with claim 15 further comprising:
an address counter that outputs an incremented count value after the writing of the data for the determined bits to the memory array;
a subtracter that sets a read address to the memory array to a value of the incremented count value minus one; and
a data buffer latches the write data for the determined bit as a latch data;
wherein the read/write controller reads the stored data stored in the memory area to which writing has been performed by the read address set at the subtracter, compares the stored data with the latch data and then checks whether the stored data matches the latch data.

18. A semiconductor memory device comprising:
a non-volatile memory array; and
a read/write controller that controls writing data to said memory array and reading data out of said memory array; wherein,
said read/write controller:
when a request to write data to said memory array is received, writes inputted multibit write data to a multibit memory area to which the inputted multibit write is to be written, and checks whether or not the stored data that has been stored in the memory area to which the writing was performed matches the inputted multibit write data, and if there is no match, then prohibits the writing of bits that are after said inputted multibit write data.

19. A semiconductor memory device comprising:
a non-volatile memory array; and
a read/write controller for controlling writing data to said memory array and reading data out of said memory array; wherein,
said read/write controller:
when a request of writing data to said memory array is received, writes inputted n-bit (where n is an integer of 2m, where m is a positive integer) write data to a multibit memory area to which the inputted n-bit write data is to be written; and
after said writing has been performed, checks whether or not the stored data that has been stored in the memory area to which the writing was performed matches the inputted n-bit write data, and if there is no match, then prohibits the writing of bits that are after said inputted n-bit write data.

20. A method of controlling writing in a semiconductor memory device having a non-volatile memory array, the method comprising:
receiving a request to write data to the memory array;
comparing the value of multibit write data to the value of multibit stored data in bitwise manner from the largest bit of the multibit write data, wherein the multibit write data is a data to be inputted, and wherein the value of multibit stored data is stored in a multibit memory area to which said multibit write data is to be written; and
if for the value of each bit of said stored data there is a bit that is determined to fulfill a specific magnitude relationship, writing the write data for the bit that has been so determined, after which checking whether or not the stored data that has been stored in the memory area to which writing has been performed matches said write data for said bit that had been determined, if there is a match, writing the write data of a bit that is after said bit that had been determined, but if there is no match, prohibiting the writing of the write data of all bits that are after said bit that had been determined.

21. A method of controlling writing in a semiconductor memory device having a non-volatile memory array, the method comprising:
receiving a request to write data to the memory array;
comparing the value of multibit write data to the value of multibit stored data in bitwise manner from the largest bit of the multibit write data, wherein the multibit write data is a data to be inputted, and wherein the value of multibit stored data is stored in a multibit memory area to which said multibit write data is to be written; and
if for the value of each bit of said stored data there is a bit that is determined to fulfill a specific magnitude relationship, writing all at once for the write data for the n bits (where n is an integer of 2m, where m is a positive integer) starting with said bit that has been so determined, after which checking whether or not the stored data that has been stored in the memory area to which writing has been performed matches said write data for said bits that had been determined, if there is a match, writing, in n-bit units, the write data of bits starting n bits after said bits that had been determined, but if there is no match, prohibiting the writing of the write data of bits starting n bits after said bit that had been determined.

22. A method of controlling writing in a semiconductor memory device having a non-volatile memory array, the method comprising:
   receiving a request to write data to the memory array;
   writing inputted multibit write data to a multibit memory area to which said inputted multibit write data is to be written; and
   after said writing, checking whether or not the stored data that has been stored in the memory area to which the writing was performed matches the inputted multibit write data, and if there is no match, then prohibiting the writing of bits that are after said inputted multibit write data.

23. A method of controlling writing in a semiconductor memory device having a non-volatile memory array, the method comprising:
   receiving a request to write data to the memory array;
   writing inputted n-bit (where n is an integer of 2m, where m is a positive integer) write data is written to a multibit memory area to which said inputted n-bit write data is to be written; and
   after said writing, checking whether or not the stored data that has been stored in the memory area to which the writing was performed matches the inputted n-bit write data, and if there is no match, then prohibiting the writing of bits that are after said inputted n-bit write data.

24. A computer readable medium storing a computer program that controls writing in a semiconductor memory device having a non-volatile memory array, wherein the computer program is implemented in a computer and implements:
   function of receiving a request to write data to the memory array;
   function of comparing the value of multibit write data to the value of multibit stored data in bitwise manner from the largest bit of the multibit write data, wherein the multibit write data is a data to be inputted, and wherein the value of multibit stored data is stored in a multibit memory area to which said multibit write data is to be written; and
   if for the value of each bit of said stored data there is a bit that is determined to fulfill a specific magnitude relationship, function of writing the write data for the bit that has been so determined, after which function of checking whether or not the stored data that has been stored in the memory area to which writing has been performed matches said write data for said bit that had been determined, if there is a match, function of writing the write data of a bit that is after said bit that had been determined, but if there is no match, function of prohibiting the writing of the write data of all bits that are after said bit that had been determined.

25. A computer readable medium storing a computer program that controls writing in a semiconductor memory device having a non-volatile memory array, wherein the computer program is implemented in a computer and implements:
   function of receiving a request to write data to the memory array;
   function of comparing the value of multibit write data to the value of multibit stored data in bitwise manner from the largest bit of the multibit write data, wherein the multibit write data is a data to be inputted, and wherein the value of multibit stored data is stored in a multibit memory area to which said multibit write data is to be written; and
   if for the value of each bit of said stored data there is a bit that is determined to fulfill a specific magnitude relationship, function of writing all at once for the write data for the n bits (where n is an integer of 2m, where m is a positive integer) starting with said bit that has been so determined, after which function of checking whether or not the stored data that has been stored in the memory area to which writing has been performed matches said write data for said bits that had been determined, if there is a match, function of writing, in n-bit units, the write data of bits starting n bits after said bits that had been determined, but if there is no match, function of prohibiting the writing of the write data of bits starting n bits after said bit that had been determined.

26. A print recording material receptor that detachably mounted onto a printing device, the print recording material receptor comprising:
   one or a plurality of print recording material receptor units to house print recording material, and
   a semiconductor memory device in accordance with any of claims 1 to 8 and 15 to 19, the semiconductor memory device storing information related to the print recording material housed in the print recording material receptor units.

27. A printing system comprising a printing device and a print recording material receptor as set forth in claim 26, detachably mounted onto the printing device, wherein:
   said printing device includes a host computer, wherein the host computer is connected to a semiconductor memory device of the print recording material receptor through a data signal line, a clock signal line, a reset signal line, a positive power supply line and a negative power supply line, and sends data of the quantity of the print recording material consumed in the printing device to the semiconductor memory device; and
   said semiconductor memory device attached to said print recording material receptor stores, in said memory array, the quantity data regarding the print recording material that has been received.

* * * * *